US012566423B2

(12) United States Patent
Yamaguchi et al.

(10) Patent No.: US 12,566,423 B2
(45) Date of Patent: Mar. 3, 2026

(54) TEMPERATURE CONTROL METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Hideto Yamaguchi, Toyama (JP); Masaaki Ueno, Toyama (JP); Seiya Shigematsu, Toyama (JP); Masashi Sugishita, Toyama (JP); Shuhei Maeda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 433 days.

(21) Appl. No.: 18/180,615

(22) Filed: Mar. 8, 2023

(65) Prior Publication Data

US 2023/0221700 A1 Jul. 13, 2023

Related U.S. Application Data

(63) Continuation of application No. PCT/JP2020/036712, filed on Sep. 28, 2020.

(51) Int. Cl.
*G05B 19/4099* (2006.01)
*H01L 21/67* (2006.01)

(52) U.S. Cl.
CPC .... *G05B 19/4099* (2013.01); *H01L 21/67098* (2013.01); *G05B 2219/45031* (2013.01)

(58) Field of Classification Search
CPC ........ G16H 10/60; G16H 15/00; G16H 40/20; G16H 50/20; G16H 50/30; G16H 70/20;
(Continued)

(56) References Cited

U.S. PATENT DOCUMENTS

| | | | |
|---|---|---|---|
| 6,496,749 | B1 | 12/2002 | Yamaguchi et al. |
| 2006/0188240 | A1* | 8/2006 | Tanaka .............. H01L 21/67109 |
| | | | 392/416 |
| 2008/0046110 | A1 | 2/2008 | Sugishita et al. |
| 2009/0107978 | A1 | 4/2009 | Sugishita et al. |
| 2013/0204416 | A1 | 8/2013 | Takahashi et al. |

(Continued)

FOREIGN PATENT DOCUMENTS

| | | |
|---|---|---|
| JP | 2000-183072 A | 6/2000 |
| JP | 2013-161857 A | 8/2013 |

(Continued)

OTHER PUBLICATIONS

Request for the Submission of an Opinion with English translation in Korean Application No. 10-2023-7007830, dated Oct. 7, 2024, 11 pages.

(Continued)

*Primary Examiner* — Kidest Worku
(74) *Attorney, Agent, or Firm* — Edell, Shapiro & Finnan, LLC

(57) ABSTRACT

According to one aspect of the technique of the present disclosure, there is provided a temperature control method including: (a) controlling a current heater supply power such that a predicted temperature column calculated according to a prediction model stored in advance approaches a future target temperature column, wherein the future target temperature column is updated in accordance with a current temperature, a final target temperature and one of a temperature convergence ramp rate and a designated temperature convergence time.

15 Claims, 14 Drawing Sheets

(58) Field of Classification Search
CPC ........ G16H 30/40; G16H 40/67; G16H 50/70; G16H 20/00; G16H 30/00
See application file for complete search history.

(56) References Cited

U.S. PATENT DOCUMENTS

| | | | | |
|---|---|---|---|---|
| 2016/0378092 | A1* | 12/2016 | Yamamoto | G05B 19/404 |
| | | | | 700/300 |
| 2017/0011974 | A1* | 1/2017 | Yokawa | H01L 21/67248 |
| 2018/0211853 | A1* | 7/2018 | Oka | H01L 21/67253 |
| 2019/0267267 | A1 | 8/2019 | Yamaguchi et al. | |
| 2019/0276938 | A1 | 9/2019 | Sugishita et al. | |
| 2021/0028032 | A1 | 1/2021 | Ota et al. | |

FOREIGN PATENT DOCUMENTS

| | | |
|---|---|---|
| JP | 2019-145730 A | 8/2019 |
| JP | 2019-160910 A | 9/2019 |
| TW | 201939603 A | 10/2019 |
| WO | 2006/070552 A1 | 7/2006 |
| WO | 2007/102454 A1 | 9/2007 |
| WO | 2018/100826 A1 | 6/2018 |

OTHER PUBLICATIONS

First Office Action with English translation in Chinese Application No. 202080103568.X, dated Mar. 27, 2025, 28 pages.
Letter of Examination Report with English translation in Taiwan Application No. 110126192, dated Feb. 17, 2022, 11 pages.
Letter of Examination Report with English translation in Taiwan Application No. 110126192, dated Oct. 31, 2022, 8 pages.
Request for the Submission of an Opinion with English translation in Korean Application No. 10-2023-7007830, issued Jun. 16, 2025, 27 pages.

* cited by examiner

FIG. 4A

| REFERENCE TEMPERATURE | POWER SUPPLY AMOUNT | | | | |
|---|---|---|---|---|---|
| 101 °C | ZONE A | ZONE B | ZONE C | ZONE D | ZONE E |
|  | 11% | 21% | 31% | 41% | 51% |

FIG. 4B

| REFERENCE TEMPERATURE | POWER SUPPLY AMOUNT | | | | |
|---|---|---|---|---|---|
| 111 °C | ZONE A | ZONE B | ZONE C | ZONE D | ZONE E |
|  | 11% | 21% | 31% | 41% | 51% |

FIG. 4C

| REFERENCE TEMPERATURE | POWER SUPPLY AMOUNT | | | | |
|---|---|---|---|---|---|
| 202 °C | ZONE A | ZONE B | ZONE C | ZONE D | ZONE E |
|  | 12% | 22% | 32% | 42% | 52% |

FIG. 4D

| REFERENCE TEMPERATURE | POWER SUPPLY AMOUNT | | | | |
|---|---|---|---|---|---|
| 212 °C | ZONE A | ZONE B | ZONE C | ZONE D | ZONE E |
|  | 12% | 22% | 32% | 42% | 52% |

FIG. 5

| REFERENCE TEMPERATURE OF HEATER TEMPERATURE | | | | | REFERENCE TEMPERATURE OF FURNACE TEMPERATURE | | | | | POWER SUPPLY AMOUNT | | | | |
| ZONE A | ZONE B | ZONE C | ZONE D | ZONE E | ZONE A | ZONE B | ZONE C | ZONE D | ZONE E | ZONE A | ZONE B | ZONE C | ZONE D | ZONE E |
|---|---|---|---|---|---|---|---|---|---|---|---|---|---|---|
| 100 °C | 110 °C | 120 °C | 130 °C | 140 °C | 200 °C | 210 °C | 220 °C | 230 °C | 240 °C | 10 % | 20 % | 30 % | 40 % | 50 % |

START

WAFER CHARGING STEP ~ S101

BOAT LOADING STEP ~ S102

PROCESSING STEP ~ S103

BOAT UNLOADING STEP ~ S104

END

FURNACE TEMPERATURE [°C]

TARGET TEMPERATURE

TIME [MINUTES]

FURNACE TEMPERATURE [°C]

TARGET TEMPERATURE

TIME [MINUTES]

TEMPERATURE CONTROL METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS REFERENCE TO RELATED APPLICATIONS

This application is a continuation application of PCT International Application No. PCT/JP2020/036712, filed on Sep. 28, 2020, the entire contents of which are hereby incorporated by reference.

TECHNICAL FIELD

The present disclosure relates to a temperature control method, a method of manufacturing a semiconductor device, a non-transitory computer-readable recording medium and a substrate processing apparatus.

BACKGROUND

For example, in order to form a film on a substrate to be processed, the substrate is accommodated in a furnace of a semiconductor manufacturing apparatus and an inside of the furnace is heated. In addition, in order to maintain an inner temperature of the furnace at an appropriate temperature or to make the inner temperature of the furnace follow a predetermined temperature change, a control structure such as a controller of the semiconductor manufacturing apparatus performs a temperature control based on a temperature set in advance.

According to a commonly used temperature control, an amount of electric power of the heater of heating the inside of the furnace is controlled by a feedback control based on a proportional, integral and derivative (hereinafter, simply referred to as a "PID") calculation so that the inner temperature of the furnace approaches a desired temperature. It is preferable to set in advance an appropriate proportional parameter, an integral parameter and a derivative parameter (hereinafter, simply referred to as a "PID parameter") in the feedback control based on the PID calculation. It is also preferable that the PID parameter is set to an optimal value in advance in accordance with the temperature characteristics of the heater.

For example, according to a related art, a semiconductor manufacturing apparatus including a switch is disclosed. The switch is configured to switch between an operation amount output by a pattern generator and an operation amount output by a regulator (which is an adjusting structure) to which a target value and a control detection value are input via an adder, and is further configured to output the switched operation amount. In addition, according to another related art, a semiconductor manufacturing apparatus capable of preventing a deviation (or a variation) in a control performance by an adjuster is disclosed. The deviation can be prevented by automatically acquiring the temperature characteristics of the heater in advance and then performing the temperature control using the temperature characteristics of the heater.

However, in the temperature control as described above, in a case where a substrate retainer accommodating the substrate is inserted into the furnace, an overshoot may occur when the inner temperature of the furnace returns to an original temperature inside the furnace after dropping once. As a result, a recovery time for the inner temperature of the furnace to converge may become longer.

SUMMARY

According to the present disclosure, there is provided a technique capable of quickly converging to a target temperature by suppressing an overshoot that may occur when inserting a substrate into a furnace.

According to one aspect of the technique of the present disclosure, there is provided a temperature control method including: (a) controlling a current heater supply power such that a predicted temperature column calculated according to a prediction model stored in advance approaches a future target temperature column, wherein the future target temperature column is updated in accordance with a current temperature, a final target temperature and one of a temperature convergence ramp rate and a designated temperature convergence time.

BRIEF DESCRIPTION OF THE DRAWINGS

FIGS. 4A through 4D are diagrams schematically illustrating examples of data stored in a prediction model memory area shown in FIG. 3.

FIG. 5 is a diagram schematically illustrating another example of data stored in the prediction model memory area shown in FIG. 3.

FIG. 6 is a block diagram schematically illustrating an internal control configuration of the temperature controller according to the first embodiment of the present disclosure.

FIG. 10 is a block diagram schematically illustrating an internal control configuration of the temperature controller in the example of the procedure of automatically acquiring the thermal characteristics shown in FIG. 9.

DETAILED DESCRIPTION

Embodiments of Present Disclosure

Hereinafter, embodiments according to the technique of the present disclosure will be described.

First Embodiment of Present Disclosure

Figure 1:
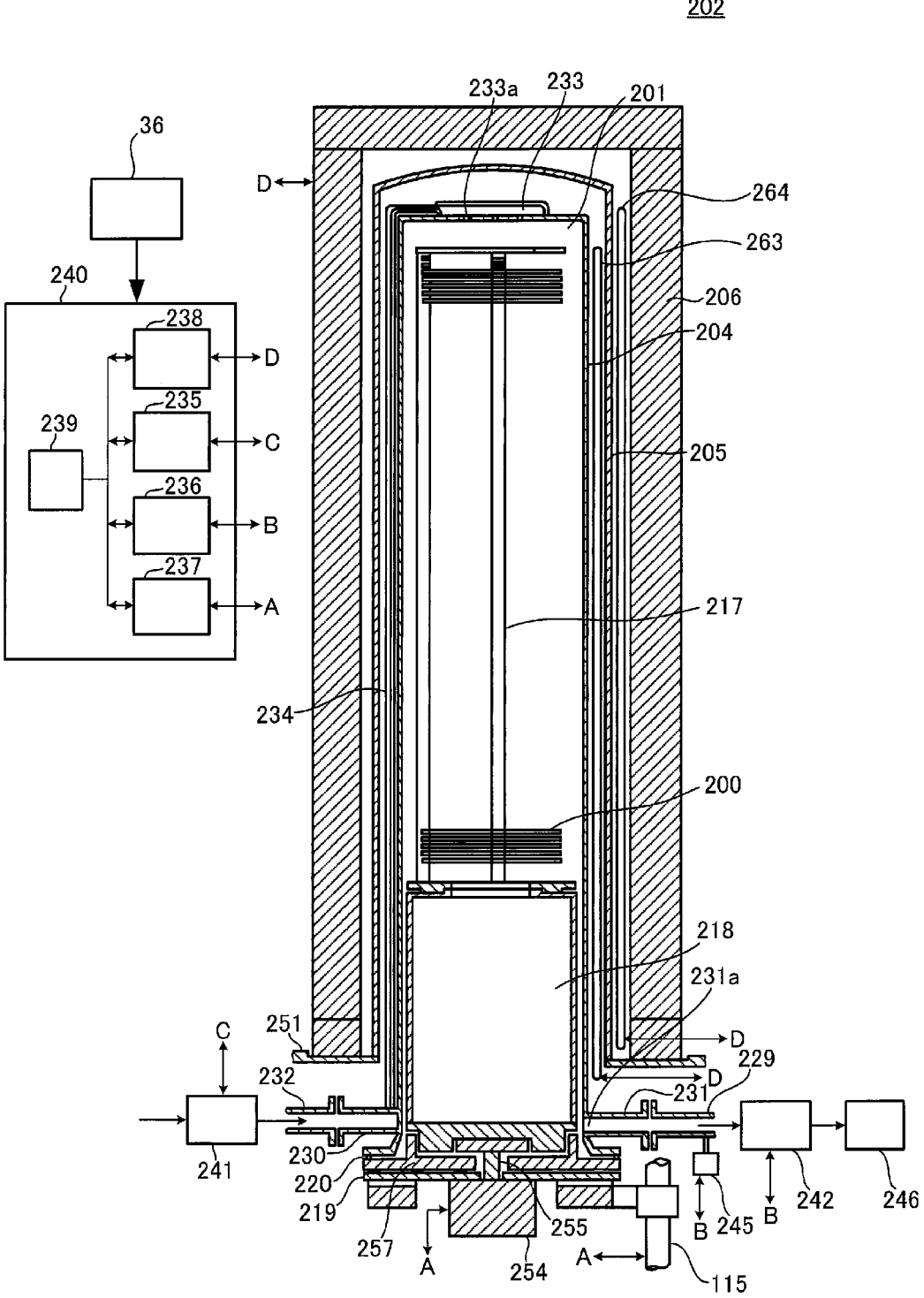
FIG. 1 is a diagram schematically illustrating a vertical cross-section of a process furnace of a substrate processing apparatus according to a first embodiment of the present disclosure.

FIG. 1 is a diagram schematically illustrating a vertical cross-section of a process furnace 202 of a substrate processing apparatus preferably used for manufacturing a semiconductor device in the embodiments including the first embodiment described herein. In addition, the drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

As shown in FIG. 1, the process furnace 202 includes a heater 206 serving as a heating structure. The heater 206 is of a cylindrical shape, and is vertically installed while being supported by a heater base 251 serving as a support plate.

A soaking tube (also referred to as an "outer tube") 205 is provided on an inner side of the heater 206 in a manner concentric with the heater 206. For example, the soaking tube 205 is made of a heat resistant material such as silicon carbide (SiC), and is of a cylindrical shape with a closed upper end and an open lower end. A reaction tube (also referred to as an "inner tube") 204 is provided on an inner side of the soaking tube 205 in a manner concentric with the soaking tube 205. For example, the reaction tube 204 is made of a heat resistant material such as quartz (SiO2), and is of a cylindrical shape with a closed upper end and an open lower end. A process chamber 201 is provided in a hollow cylindrical portion of the reaction tube 204. The process chamber 201 is configured to be capable of accommodating vertically arranged wafers including a wafer 200 serving as a substrate in a horizontal orientation in a multistage manner by a boat 217 described later. Hereinafter, the wafers including the wafer 200 may also be referred to as "wafers 200".

A gas introduction structure 230 is provided at a lower end portion of the reaction tube 204. A thin pipe 234 serving as a gas introduction pipe is disposed along an outer wall of the reaction tube 204 from the gas introduction structure 230 to a ceiling portion 233 of the reaction tube 204. A gas supplied through the gas introduction structure 230 flows upward in the thin pipe 234 to the ceiling portion 233, and then is supplied into the process chamber 201 through a plurality of gas introduction ports 233a provided in the ceiling portion

233. In addition, a gas exhaust structure 231 through which an inner atmosphere of the reaction tube 204 is exhausted via an exhaust port 231a is provided at the lower end portion of the reaction tube 204 at a location different from a location where the gas introduction structure 230 is provided.

A gas supply pipe 232 is connected to the gas introduction structure 230. A process gas supply source (not shown), a carrier gas supply source (not shown) and an inert gas supply source (not shown) are connected upstream of the gas supply pipe 232 at a location opposite to the gas introduction structure 230 via an MFC (mass flow controller) 241 serving as a gas flow rate controller. When it is preferable to supply water vapor into the process chamber 201, a water vapor generating apparatus (not shown) is provided at the gas supply pipe 232 at a downstream of the MFC 241. A gas flow rate controller 235 is electrically connected to the MFC 241, and is configured to be capable of controlling the MFC 241 such that a flow rate of the gas supplied into the process chamber 201 is capable of being set to a desired flow rate at a desired timing.

A gas exhaust pipe 229 is connected to the gas exhaust structure 231. An exhaust apparatus 246 is connected to the gas exhaust pipe 229 at a location opposite to the gas exhaust structure 231 via a pressure sensor 245 serving as a pressure detector and a pressure regulator (which is a pressure adjusting structure) 242. The exhaust apparatus 246 is configured to be capable of exhausting the process chamber 201 such that an inner pressure of the process chamber 201 is capable of being set to a desired pressure. A pressure controller 236 is electrically connected to the pressure sensor 245 and the pressure regulator 242. The pressure controller 236 is configured to be capable of controlling the pressure regulator 242 based on the pressure detected by the pressure sensor 245 such that the inner pressure of the process chamber 201 is capable of being set to a desired pressure at a desired timing.

A base 257 serving as a holding structure capable of airtightly closing a lower end opening of the reaction tube 204 and a seal cap 219 serving as a furnace opening lid are provided at the lower end portion of the reaction tube 204. For example, the seal cap 219 is made of a metal material such as stainless steel, and is of a disk shape. For example, the base 257 is made of a material such as quartz, and is of a disk shape. The base 257 is provided on the seal cap 219. An O-ring 220 serving as a seal is provided on an upper surface of the base 257, and is in contact with the lower end of the reaction tube 204. A rotator 254 configured to rotate the boat 217 is provided at the seal cap 219 at a location opposite to the process chamber 201. A rotating shaft 255 of the rotator 254 is connected to the boat 217 and a heat insulating cylinder 218 through the seal cap 219 and the base 257. As the rotator 254 rotates the boat 217 and the heat insulating cylinder 218, the wafers 200 are rotated. The seal cap 219 may be elevated or lowered vertically by a boat elevator 115 serving as an elevating structure vertically provided outside the reaction tube 204. When the seal cap 219 is elevated or lowered by the boat elevator 115, the boat 217 may be loaded into the process chamber 201 or unloaded out of the process chamber 201. An operation controller 237 is electrically connected to the rotator 254 and the boat elevator 115. The operation controller 237 is configured to be capable of controlling the rotator 254 and the boat elevator 115 such that the rotator 254 and the boat elevator 115 perform desired operations at a desired timing.

For example, the boat 217 serving as a substrate retainer is made of a heat resistant material such as quartz and silicon carbide. The boat 217 is configured to support the wafers 200 while the wafers 200 are horizontally oriented with their centers aligned with each other. The heat insulating cylinder 218 serving as a heat insulating structure is provided under the boat 217 so as to support the boat 217. For example, the heat insulating cylinder 218 is made of a heat resistant material such as quartz and silicon carbide, and is of a cylindrical shape. The heat insulating cylinder 218 is configured to suppress the transmission of the heat from the heater 206 to the lower end of the reaction tube 204.

Two types of sensors serving as temperature detectors are provided in the process furnace 202. That is, a first temperature sensor 263 serving as the temperature detector is provided between the reaction tube 204 and the soaking tube 205, and a second temperature sensor 264 serving as the temperature detector is provided between the soaking tube 205 and the heater 206. Each of the first temperature sensor 263 and the second temperature sensor 264 uses a plurality of thermocouples to detect a temperature. The first temperature sensor 263 and the second temperature sensor 264 will be described later in detail. A temperature controller 238 is electrically connected to the heater 206, the first temperature sensor 263 and the second temperature sensor 264.

A main controller 240 is constituted by the gas flow rate controller 235, the pressure controller 236, the operation controller 237, the temperature controller 238 and a manipulation controller 239. The manipulation controller 239 includes an input/output device (not shown) and a display (not shown), and is configured to exchange data with the gas flow rate controller 235, the pressure controller 236, the operation controller 237 and the temperature controller 238. A host controller 36 is connected to the main controller 240. The host controller 36 may include components such as an input/output device (not shown) in a manner similar to the manipulation controller 239. The main controller 240 may be controlled based on the host controller 36.

Figure 2:
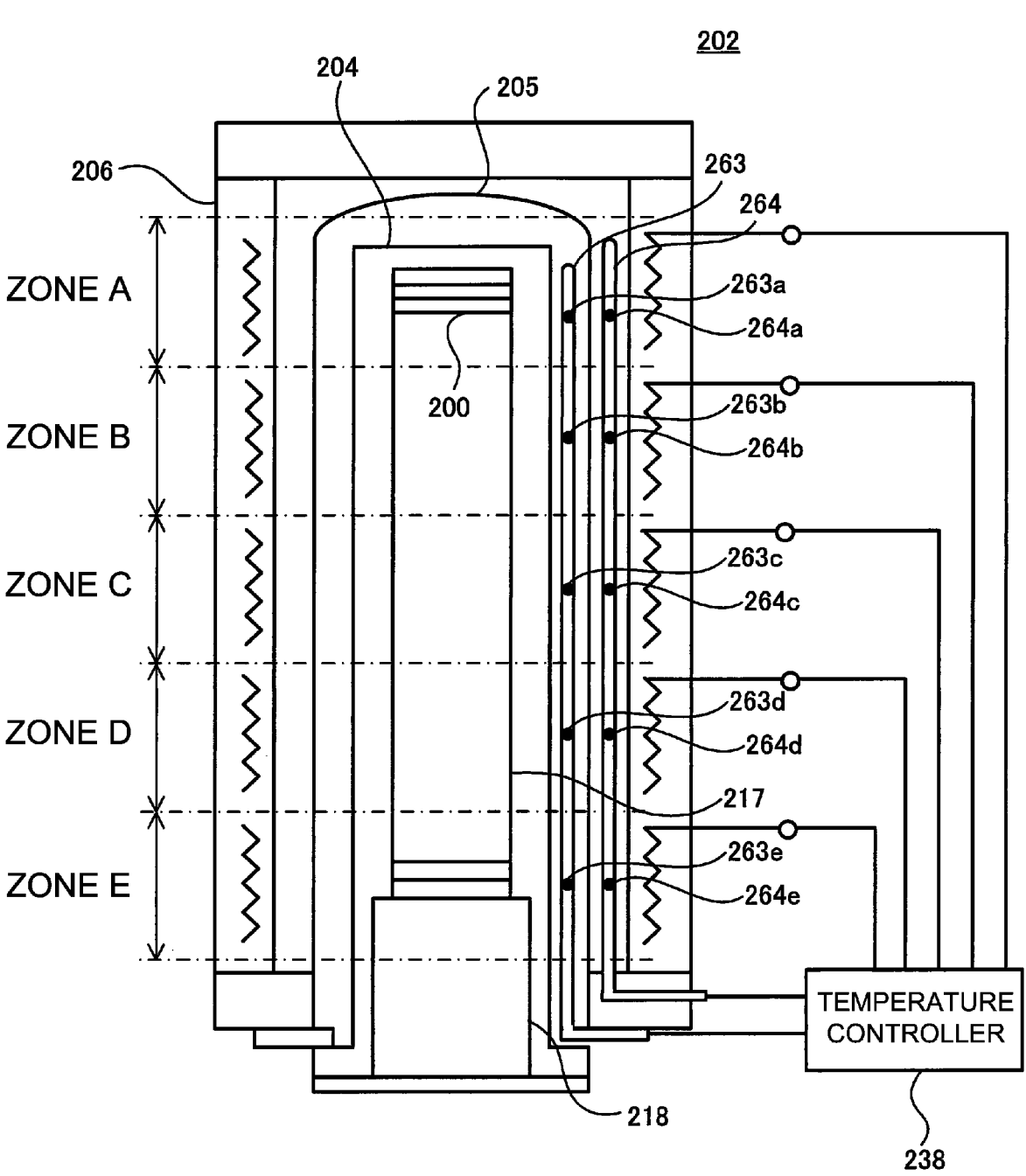
FIG. 2 is a diagram schematically illustrating an exemplary configuration in which a temperature of a heater is adjusted by a temperature controller according to the first embodiment of the present disclosure.

FIG. 2 is a diagram schematically illustrating an exemplary configuration in which a temperature of the heater 206 is adjusted by the temperature controller 238 by using the first temperature sensor 263 and the second temperature sensor 264.

According to the exemplary configuration shown in FIG. 2, the heater 206 (or a space in the process furnace 202 corresponding thereto) is divided into five zones in the vertical direction, that is, "ZONE A", "ZONE B", "ZONE C", "ZONE D" and "ZONE E" from the top to the bottom of the heater 206. The "ZONE A", "ZONE B", "ZONE C", "ZONE D" and "ZONE E" may also be referred to as a "first zone", a "second zone", a "third zone", a "fourth zone" and a "fifth zone", respectively.

The first temperature sensor 263 is configured to detect the temperature between the reaction tube 204 and the soaking tube 205. In the first temperature sensor 263, thermocouples 263a, 263b, 263c, 263d and 263e serving as cascade thermocouples are installed corresponding to each zone described above.

The second temperature sensor 264 is configured to detect the temperature between the soaking tube 205 and the heater 206. In the second temperature sensor 264, thermocouples 264a, 264b, 264c, 264d and 264e serving as heater thermocouples are installed corresponding to each zone described above.

That is, the temperature controller 238 is configured to be capable of adjusting the state of electrical conduction to each zone of the heater 206 based on temperature information detected by the thermocouples 263a through 263e and the thermocouples 264a through 264e such that an inner temperature of the process chamber 201 is capable of being adjusted (or controlled) to a process temperature set in advance by the host controller 36 at a desired timing.

In the following description, the temperature detected by the second temperature sensor 264 (that is, the thermocouples 264a through 264e) may also be referred to as a "heater temperature", and the temperature detected by the first temperature sensor 263 (that is, the thermocouples 263a through 263e) may also be referred to as a "furnace temperature" (which is an inner temperature of a furnace such as the process furnace 202).

Figure 3:
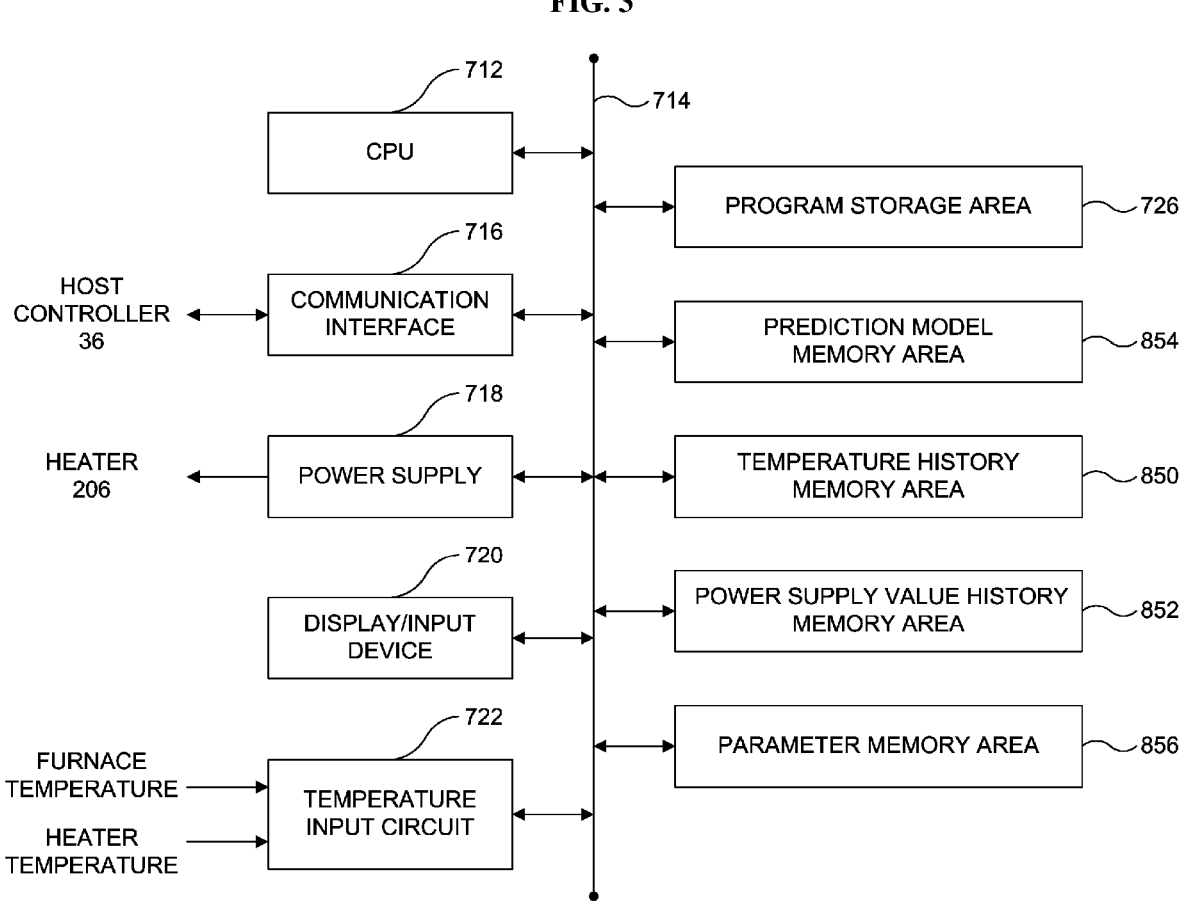
FIG. 3 is a block diagram schematically illustrating a configuration of the temperature controller according to the first embodiment of the present disclosure.

FIG. 3 is a block diagram schematically illustrating a configuration of the temperature controller 238.

As shown in FIG. 3, the temperature controller 238 includes components such as a CPU (Central Processing Unit) 712, a communication interface (IF) 716, a power supply 718, a display/input device 720 and a temperature input circuit 722. The components of the temperature controller 238 are connected to one another via a control bus 714. A memory structure such as a memory and a storage is connected to the control bus 714. The memory structure may include areas such as a program storage area 726, a prediction model memory area 854, a temperature history memory area 850, a power supply value history memory area 852 and a parameter memory area 856.

In the temperature history memory area 850, a history (heater temperature information) of temperature data of the heater temperature (which is the temperature of the heater 206 detected by the second temperature sensor 264 via the temperature input circuit 722) is stored for a certain period. In addition, a history of temperature data (furnace temperature information) of the furnace temperature (which is the inner temperature of the process chamber 201 detected by the first temperature sensor 263 via the temperature input circuit 722) is stored for a certain period.

In the power supply value history memory area 852, a history (power supply value information) of a power supply value (which ranges from 0% to 100%) to the heater 206 is stored only for a certain period.

In the prediction model memory area 854, a prediction model of estimating a predicted temperature of at least one among the heater temperature or the furnace temperature is stored for each of temperature ranges. Specifically, coefficients related to the prediction model, a coefficient error correlation matrix described later, a reference temperature and a steady state power value are stored. The coefficients related to the prediction model, the coefficient error correlation matrix, the reference temperature and the steady state power value are stored for each of the heater temperature and the furnace temperature of each zone. In addition, the prediction model related to the heater temperature in every zone of the heater is paired with the prediction model related to the furnace temperature in every zone of the heater to be stored as a pair for each temperature range. As such, the prediction model memory area 854 stores a plurality of such pairs respectively corresponding to the temperature ranges. Thus, the prediction model is configured to cope with a plurality of temperature ranges.

In the present specification, the reference temperature refers to a temperature when the heater temperature and the furnace temperature are in a steady state. Further, the steady state power value refers to a reference value of the prediction model, and may be the power supply value for each zone when the heater temperature and the furnace temperature are in the steady state at the reference temperature.

For example, in the prediction model memory area 854, the data related to the prediction model is stored in a table format as shown in FIGS. 4A, 4B, 4C and 4D or as shown in FIG. 5.

FIG. 4A illustrates a reference value related to the prediction model of the heater temperature of "ZONE A". Specifically, FIG. 4A illustrates a reference temperature of 101° C. and a power supply amount for each zone when the heater temperature of "ZONE A" is in the steady state at the reference temperature of 101° C. FIG. 4B illustrates a reference value related to the prediction model of the heater temperature of "ZONE B". Specifically, FIG. 4B illustrates a reference temperature of 111° C. and the power supply amount for each zone when the heater temperature of "ZONE B" is in the steady state at the reference temperature of 111° C. Tables similar to those shown in FIGS. 4A and 4B are prepared and stored for reference values related to the prediction models of the heater temperature of "ZONE C", "ZONE D" and "ZONE E", respectively.

FIG. 4C illustrates a reference value related to the prediction model of the furnace temperature of "ZONE A". Specifically, FIG. 4C illustrates a reference temperature of 202° C. and the power supply amount for each zone when the furnace temperature of "ZONE A" is in the steady state at the reference temperature of 202° C. FIG. 4D illustrates a reference value related to the prediction model of the furnace temperature of "ZONE B". Specifically, FIG. 4D illustrates a reference temperature of 212° C. and the power supply amount for each zone when the furnace temperature of "ZONE B" is in the steady state at the reference temperature of 212° C. Tables similar to those shown in FIGS. 4C and 4D are prepared and stored for reference values related to the prediction models of the furnace temperature of "ZONE C", "ZONE D" and "ZONE E", respectively.

FIG. 5 illustrates another example of the data stored in the prediction model memory area 854. Referring to FIG. 5, the heater temperature is 100° C. and the furnace temperature is 200° C. in "ZONE A", the heater temperature is 110° C. and the furnace temperature is 210° C. in "ZONE B", the heater temperature is 120° C. and the furnace temperature is 220° C. in "ZONE C", the heater temperature is 130° C. and the furnace temperature is 230° C. in "ZONE D" and the heater temperature is 140° C. and the furnace temperature is 240° C. in "ZONE E" when the power supply amount for each zone is maintained as described below and the steady state is reached after sufficient time has elapsed. Specifically, the power supply amount of "ZONE A" is 10%, the power supply amount of "ZONE B" is 20%, the power supply amount of "ZONE C" is 30%, the power supply amount of "ZONE D" is 40% and the power supply amount of "ZONE E" is 50%. In the example shown in FIG. 5, the power supply value should be adjusted according to the steady state. However, a memory area such as the prediction model memory area 854 can be made smaller as compared with those shown in FIGS. 4A through 4D.

Various parameters for realizing the prediction model are stored in the parameter memory area 856.

In the program storage area 726, a temperature control program is stored. The temperature control program is configured to select the prediction model in a predetermined temperature range, to input the temperature data and to control the components such as the heater 206 such that the predicted temperature becomes optimal. In addition, in the program storage area 726, stored is a program that causes the substrate processing apparatus to perform a procedure of controlling a current heater supply power such that a predicted temperature column calculated according to a furnace temperature prediction model stored in advance can approach a future target temperature column.

The CPU 712 executes a predetermined processing based on the temperature control program stored in the memory structure such as a memory and a storage (that is, the program storage area 726 in the memory structure). The CPU 712 is configured to be capable of communicating with the host controller 36 via the communication IF 716 and acquiring a target temperature. In addition, the CPU 712 is configured to be capable of detecting the furnace temperature and the heater temperature, outputting a control signal to the power supply 718 via the temperature input circuit 722, and controlling the amount of the power (electric power) supplied to each of the "ZONE A" through "ZONE E" of the heater 206.

That is, the temperature controller 238 is configured to be capable of controlling the heater 206 by acquiring the data such as the history of the temperature data, the history of the power supply value and the various parameters from the temperature history memory area 850, the power supply value history memory area 852 and the parameter memory area 856, respectively, and executing the temperature control program using the prediction model stored in the prediction model memory area 854. The embodiments including the first embodiment will be described by way of an example in which the temperature controller 238 executes the program that causes the substrate processing apparatus to perform the procedure of controlling the current heater supply power such that the predicted temperature column calculated according to the furnace temperature prediction model stored in advance can approach the future target temperature column. In addition, according to the embodiments, the program described above further causes the substrate processing apparatus to perform: a procedure of creating a characteristics equation using the prediction model; and a procedure of calculating a solution of the characteristics equation.

The display/input device 720 is configured to display and input the data such as the various parameters stored in the parameter memory area 856.

<Prediction Model>

Hereinafter, the prediction model stored in the prediction model memory area 854 will be described. In the present specification, the prediction model refers to a mathematical formula for calculating the predicted temperature. For example, the following Mathematical Relation 1 is used as the prediction model.

$$\Delta y(t) = a_1 \cdot y(t-1) + a_2 \cdot y(t-2) + ma_1 \cdot p_a(t-1) + ma_2 \cdot p_a(t-2) + \dots + ma_n \cdot p_a(t-n)$$

$$+ mb_1 \cdot p_b(t-1) + mb_2 \cdot p_b(t-2) + \dots + mb_n \cdot p_b(t-n)$$

$$+ mc_1 \cdot p_c(t-1) + mc_2 \cdot p_c(t-2) + \dots + mc_n \cdot p_c(t-n)$$

$$+ md_1 \cdot p_d(t-1) + md_2 \cdot p_d(t-2) + \dots + md_n \cdot p_d(t-n)$$

$$+ me_1 \cdot p_e(t-1) + me_2 \cdot p_e(t-2) + \dots + me_n \cdot p_e(t-n) \qquad \text{[Mathematical Relation 1]}$$

Hereinafter, the Mathematical Relation 1 may also be referred to as "Formula 1".

In the Formula 1, the symbol $\Delta y(t)$ indicates a deviation of the predicted temperature from the reference temperature at time t, and the symbols $y(t-1)$ and $y(t-2)$ indicate deviations from the reference temperature of the temperature one time before [that is, at time $(t-1)$] and two times before [that is, at time $(t-2)$], respectively. In addition, the symbols $pa(t-1)$, $pa(t-2)$ through $pa(t-n)$ indicate deviations from the steady state power value of the power supply values of "ZONE A" one time before, two times before through n times before [that is, at time (t–n)], respectively, the symbols pb(t–1), pb(t–2) through pb(t–n) indicate deviations from the steady state power value of the power supply values of "ZONE B" one time before, two times before through n times before, respectively, the symbols pc(t–1), pc(t–2) through pc(t–n) indicate deviations from the steady state power value of the power supply values of "ZONE C" one time before, two times before through n times before, respectively, the symbols pd(t–1), pd(t–2) through pd(t–n) indicate deviations from the steady state power value of the power supply values of "ZONE D" one time before, two times before through n times before, respectively, and the symbols pe(t–1), pe(t–2) through pe(t–n) indicate deviations from the steady state power value of the power supply values of "ZONE E" one time before, two times before through n times before, respectively.

In the Formula 1, the symbols a1, a2, ma1 through man, mb1 through mbn, mc1 through mcn, md1 through mdn, me1 through men are coefficients corresponding to the respective deviations described above, the symbol bi is a constant term, and the symbol n is a value set in advance in the parameter memory area 856.

In the Formula 1, since $\Delta y(t)$ is the deviation from the reference temperature of the predicted temperature at time t, the final predicted temperature is obtained by adding the $\Delta y(t)$ and the reference temperature. However, $\Delta y(t)$ itself may be simply described as the predicted temperature in the following description in some cases.

The prediction model is stored for each of the heater temperature and the furnace temperature for each zone, and can be used for a control computation. Specifically, for example, the prediction model related to the predicted temperature of the furnace temperature of "ZONE A" and the prediction model related to the predicted temperature of the heater temperature of "ZONE E" may be stored. In addition, the temperature shown in the Formula 1 described above may be the heater temperature or the furnace temperature.

The reference temperature and the steady state power value are acquired at a preliminary stage of preparing the prediction model in an automatic acquisition procedure of thermal characteristics (described later). The constant term bi is an adjustment term when the reference temperature or the steady state power value acquired in advance is deviated from the actual value. If the pre-acquired reference temperature and the pre-acquired steady state power value are invariant with the lapse of time, the constant term of the prediction model shown in the Formula 1 acquired after the automatic acquisition procedure of the thermal characteristics, that is, the constant term bi is expected to be zero (0) (that is, bi=0). However, since the reference temperature and the steady state power value change from moment to moment due to the conditions such as the change of surrounding environment, the fluctuations of the power and the noise of the thermocouples, the constant term bi is included in the prediction model shown in the Formula 1.

In addition, it is assumed that the reference temperature and the steady state power value are different in value depending on the temperature range, and are nonlinear. When the reference temperature and the steady state power value are inaccurate, the accuracy of the predicted temperature decreases and the control performance is influenced. Therefore, preferably, the reference temperature and the steady state power value are acquired at a temperature close to the predetermined process temperature described above of a process such as an oxidation process and a diffusion process.

When the temperature is maintained at the reference temperature and the power supply amount is maintained at the steady state power value, according to the Formula 1, y(t–1), y(t–2) are zero and pa(t–1) through pa(t–n), pb(t–1) through pb(t–n), pc(t–1) through pc(t–n), pd(t–1) through pd(t–n) and pe(t–1) through pe(t–n) are all zero. As a result, $\Delta y(t)$ is equal to bi (that is, $\Delta y(t)$=bi), and the predicted temperature is obtained by adding the reference temperature and bi. When the reference temperature and the steady state power value are invariant and bi is zero (that is, bi=0), the predicted temperature is equal to the reference temperature. That is, in the steady state at the reference temperature, it is shown that the prediction model of the Formula 1 is valid.

Further, according to the Formula 1, for example, assuming that the Formula 1 indicates the prediction model related to the furnace temperature of "ZONE A", not only the power supply amount of "ZONE A" but also the power supply amounts of the other zones such as "ZONE B" and "ZONE C" affect the furnace temperature of "ZONE A" depending on the coefficients thereof. That is, the mutual thermal interference between the zones can be expressed based on the coefficients thereof.

In addition, according to the prediction model shown in the Formula 1 described above, it is possible to predict the surrounding temperature for a pair of reference temperatures. Since it is assumed that increasing characteristics and decreasing characteristics of the temperature varies depending on the temperature range, the prediction models of a plurality of temperature ranges may be stored in the prediction model memory area 854, and the prediction model may be selected among the prediction models.

For the prediction model of the heater temperature, in order to simplify the calculation, the following Mathematical Relation 2 may be used in some cases instead of the Formula 1.

$$\Delta y_h(t) = a_1 \cdot y_h(t-1) + a_2 \cdot y_h(t-2) + m_1 \cdot p(t-1) + m_2 \cdot p(t-2) + \ldots + m_n \cdot p(t-n) + bi \quad \text{[Mathematical Relation 2]}$$

Hereinafter, the Mathematical Relation 2 may also be referred to as "Formula 2".

In the Formula 2, the symbol $\Delta y_h(t)$ indicates the deviation of the predicted temperature of the heater temperature from the reference temperature at time t, the symbols $y_h(t-1)$ and $y_h(t-2)$ indicate the deviations of the heater temperature from the reference temperature of the temperature one time before [that is, at time (t–1)] and two times before [that is, at time (t–2)], respectively. In addition, the symbols p(t–1), p(t–2) through p(t–n) indicate deviations of the power supply values of the corresponding zone one time before, two times before through n times before from the steady state power value, respectively, the symbols a1, a2, m1, m2 through mn are coefficients corresponding to the respective deviations described above, respectively, the symbol bi is a constant term, and the symbol n is a value set in advance in the parameter memory area 856.

That is, in the Formula 2 described above, only the power supply value from the corresponding zone acts on the predicted temperature of the heater temperature. Thermal interference from the other zones is not considered. For example, when calculating the predicted temperature of the heater temperature of "ZONE A", only the power supply value of "ZONE A" is used. As shown in FIG. 2, since the thermocouple 264a of the second temperature sensor 264 is installed in the vicinity of the heater 206, it is assumed that there is no heat effect from the heater 206 in the divided other zones such as "ZONE B" through "ZONE E" or the heat effect from the heater 206 in the divided other zones is negligibly small.

In addition, in the Formula 2, since the calculation amount of the product-sum calculation is reduced as compared with that in the Formula 1, a processing of calculating the predicted temperature becomes faster. Furthermore, since the number of coefficients of the prediction model to be obtained in the automatic acquisition procedure of the thermal characteristics described later decreases, the processing becomes faster.

Figure 6:
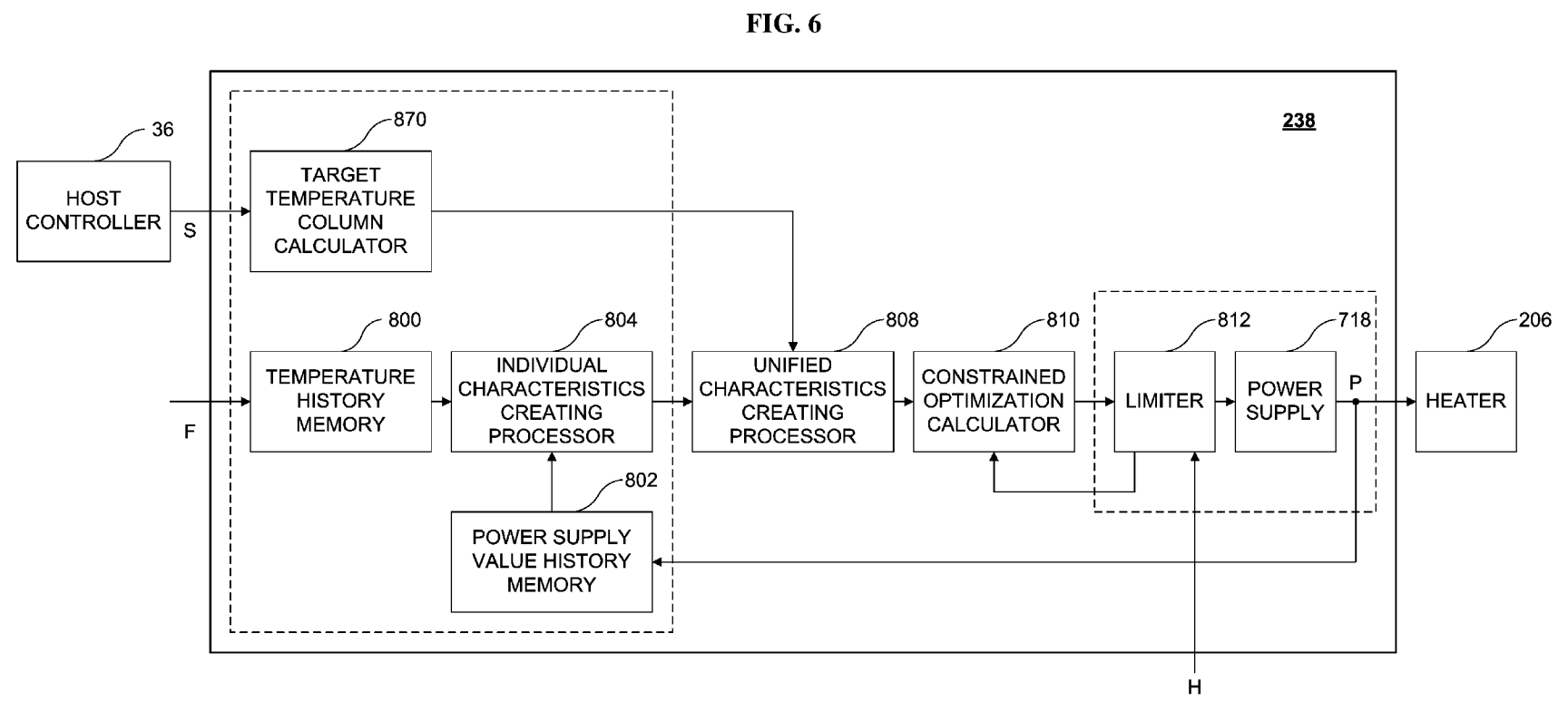

FIG. 6 is a block diagram schematically illustrating an internal control configuration of the temperature controller 238.

As shown in FIG. 6, the host controller 36 and the heater 206 are connected to the temperature controller 238, and the target temperature from the host controller 36 is input to an input terminal S. The furnace temperature from the first temperature sensor 263 is input to an input terminal F. The heater temperature from the second temperature sensor 264 is input to an input terminal H.

The target temperatures and input terminals S are present as many as the number of the thermocouples 263a through 263e of the first temperature sensor 263. However, since the input terminals S have the same configuration, only one of the input terminals S is shown in FIG. 6. Similarly, input terminals F are present as many as the number of the thermocouples 263a through 263e of the first temperature sensor 263. However, since the input terminals F have the same configuration, only one of the input terminals F is shown in FIG. 6. Similarly, input terminals H are present as many as the number of the thermocouples 264a through 264e of the second temperature sensor 264. However, since the input terminals H have the same configuration, only one of the input terminals H is shown in FIG. 6.

For example, the internal control configuration of the temperature controller 238 is constituted by a temperature history memory 800, a power supply value history memory 802, an individual characteristics creating processor 804, a target temperature column calculator 870, a unified characteristics creating processor 808, a constrained optimization calculator 810, a limiter 812 and the power supply 718.

The furnace temperature from the first temperature sensor 263 is input to the temperature history memory 800 via the input terminal F and the temperature history memory 800 stores the furnace temperature in the temperature history memory area 850 for a certain period. Specifically, the temperature history memory 800 writes furnace temperatures in a sequential order of acquiring them (i.e., from the furnace temperature initially acquired to the furnace temperature acquired at the time t) with predetermined time intervals therebetween into the temperature history memory area 850. When the temperature history memory area 850 is filled with data, the oldest data is deleted and new data is written where the oldest data is deleted. In this manner, the data of the furnace temperatures from the current time (present time) to the past time are stored always for a certain period.

In order to unify the standard of the time, the furnace temperature written by the processing at the current time t according to a control algorithm is represented by y(t–1) (that is, the temperature one time before) shown in the Formula 1. The acquired furnace temperature is a temperature calculated from an average of the electromotive forces of the thermocouples 263a through 263e from the start time up to the time of writing the furnace temperature.

The power supply value to be output via an output terminal P is input to the power supply value history memory 802, and the power supply value history memory 802 stores the data of the power supply value in the power supply value history memory area 852 for a certain period. Specifically, the power supply value history memory 802 writes power supply values in a sequential order of acquiring them (i.e., from the power supply value initially acquired to the power supply value acquired at the time t) with predetermined intervals therebetween into the power supply value history memory area 852. When the power supply value history memory area 852 is filled with data, the oldest data is deleted and new data is written where the oldest data is deleted. According to a manner described above, the data of the power supply values from the current time (present time) to the past time is stored always for a certain period.

In order to unify the standard of the time, the power supply value written by the processing at the current time t according to the control algorithm is represented by pa(t–1), pb(t–1), pc(t–1), pd(t–1) and pe(t–1) (that is, the power supply values one time before) shown in the Formula 1. The power supply value written by the processing at the current time t is a power supply value calculated from the previous processing and continuously supplied until the current time t.

The individual characteristics creating processor 804 acquires the prediction model of the furnace temperature of the zone from the prediction model memory area 854, acquires the current (that is, the time t) and past data of the furnace temperature from the temperature history memory area 850, acquires the current and past data of the power supply value from the power supply value history memory area 852, and calculates an individual input response characteristics matrix Ssr and an individual zero response characteristics vector Szr which will be described below with reference to the Mathematical Relation 3 through the Mathematical Relation 6, respectively. The individual input response characteristics matrix Ssr and the individual zero response characteristics vector Szr are calculated as many as the number of furnace temperatures to be controlled (that is, the number of the zones).

The Formula 1 described above is represented by a state space model as shown in the following Mathematical Relation 3.

$$\begin{cases} x(t+1) = A \cdot x(t) + B \cdot u(t) \\ y(t) = C \cdot x(t) \end{cases} \quad \text{[Mathematical Relation 3]}$$

Hereinafter, the Mathematical Relation 3 may also be referred to as "Formula 3".

The matrices A, B and C shown in the Formula 3 are represented as below. In order to simplify the illustration, the deviations of the power supply values of "ZONE A" through "ZONE C" four times before (that is, n is four) from the steady state power value are used. In the following, for simplicity of the illustration, the deviations of "ZONE A" through "ZONE C" up to four times before are exemplified. However, the embodiments are not limited thereto.

[Mathematical Relation 4]

$$A = \begin{bmatrix} a_1 & a_2 & ma_2 & ma_3 & ma_4 & mb_2 & mb_3 & mb_4 & mc_2 & mc_3 & mc_4 \\ 1 & 0 & 0 & 0 & 0 & 0 & 0 & 0 & 0 & 0 & 0 \\ 0 & 0 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 1 & 0 & 0 & 0 & 0 & 0 \\ 0 & 0 & 0 & 0 & 0 & 0 & 1 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & 0 & 0 & 1 & 0 & 0 \\ 0 & 0 & 0 & 0 & 0 & 0 & 0 & 0 & 0 & 1 & 0 \end{bmatrix}$$

$$B = \begin{bmatrix} ma_1 & mb_1 & mc_1 \\ 0 & 0 & 0 \\ 1 & 0 & 0 \\ 0 & 0 & 0 \\ 0 & 0 & 0 \\ 0 & 1 & 0 \\ 0 & 0 & 0 \\ 0 & 0 & 0 \\ 0 & 0 & 1 \\ 0 & 0 & 0 \\ 0 & 0 & 0 \end{bmatrix}$$

$$C = [\,1 \ 0 \ 0 \ 0 \ 0 \ 0 \ 0 \ 0 \ 0 \ 0 \ 0\,]$$

In addition, the vectors x(t), u(t) and the output y(t) are represented as the Mathematical Relation 5 below. In order to simplify the illustration, the deviations of the power supply values of "ZONE A" through "ZONE C" four times before (that is, n is four) from the steady state power value are used.

[Mathematical Relation 5]

$$x(t) = \begin{pmatrix} y(t) \\ y(t-1) \\ p_a(t-1) \\ p_a(t-2) \\ p_a(t-3) \\ p_b(t-1) \\ p_b(t-2) \\ p_b(t-3) \\ p_c(t-1) \\ p_c(t-2) \\ p_c(t-3) \end{pmatrix}$$

$$u(t) = \begin{pmatrix} p_a(t) \\ p_b(t) \\ p_c(t) \end{pmatrix}$$

$$y(t) = \Delta y(t)$$

When the power supply value at the time t, that is, u(t) is input in the Formula 3, and then u(t) is continuously input as it is, the predicted temperature after time (t+1) is represented as shown in the following Mathematical Relation 6.

[Mathematical Relation 6]

$$\begin{bmatrix} \Delta y(t+1) \\ \Delta y(t+2) \\ \Delta y(t+3) \\ \vdots \end{bmatrix} = \begin{bmatrix} y(t+1) \\ y(t+2) \\ y(t+3) \\ \vdots \end{bmatrix} = \begin{bmatrix} C \cdot A^2 \\ C \cdot A^3 \\ C \cdot A^4 \\ \vdots \end{bmatrix} \cdot x(t-1) +$$

-continued $$\begin{bmatrix} C \cdot A \cdot B \\ C \cdot A^2 \cdot B \\ C \cdot A^3 \cdot B \\ \vdots \end{bmatrix} \cdot u(t-1) + \begin{bmatrix} C \cdot B \\ \sum\limits_{i=0}^{1} C \cdot A^i \cdot B \\ \sum\limits_{i=0}^{2} C \cdot A^i \cdot B \\ \vdots \end{bmatrix} \cdot u(t)$$

$$\Delta y(t) = S_{zr} + S_{sr} \cdot u(t)$$

wherein $$\Delta y(t) = \begin{bmatrix} \Delta y(t+1) \\ \Delta y(t+2) \\ \Delta y(t+3) \\ \vdots \end{bmatrix},$$

$$S_{zr} = \begin{bmatrix} C \cdot A^2 \\ C \cdot A^3 \\ C \cdot A^4 \\ \vdots \end{bmatrix} \cdot x(t-1) + \begin{bmatrix} C \cdot A \cdot B \\ C \cdot A^2 \cdot B \\ C \cdot A^3 \cdot B \\ \vdots \end{bmatrix} \cdot u(t-1),$$

$$S_{sr} = \begin{bmatrix} C \cdot B \\ \sum\limits_{i=0}^{1} C \cdot A^i \cdot B \\ \sum\limits_{i=0}^{2} C \cdot A^i \cdot B \\ \vdots \end{bmatrix}$$

Hereinafter, "$\Delta y = S_{zr} + S_{sr} \cdot u(t)$" in the Mathematical Relation 6 may also be referred to as "Formula 4".

In the Formula 4, the symbol Szr indicates the individual zero response characteristics vector, the symbol Ssr indicates the individual input response characteristics matrix, and the symbol Δy(t) indicates a predicted temperature vector. The predicted temperature vector is a vector representation of the predicted temperature column.

The number of rows of the vectors described above is the number of the calculation of the predicted temperature, and they are calculated as many as allowable depending on a control period and a computation processing performance of the CPU 712.

The individual zero response characteristics vector Szr indicates an amount of changes in the predicted temperature vector Δy(t) due to being influenced by the furnace temperature of the past time and the power supply value of the past time, and the individual input response characteristics matrix Ssr indicates an amount of changes in the predicted temperature vector Δy(t) due to being influenced by the power supply value of the current time (that is, time t).

Hereinafter, when distinguishing the individual input response characteristics matrix Ssr, the individual zero response characteristics vector Szr and the predicted temperature vector Δy(t) according to the corresponding zone, for example, the individual input response characteristics matrix corresponding to "ZONE A" is represented by Ssr-a, the individual zero response characteristics vector corresponding to "ZONE B" is represented by Szr-b, and the predicted temperature vector corresponding to "ZONE E" is represented by Δye(t).

The target temperature from the host controller 36 is input to the target temperature column calculator 870 via the input terminal S, and the furnace temperature is input to the target temperature column calculator 870 via the input terminal F. Then, the target temperature column calculator 870 calculates a target temperature column vector Stg representing target values of future temperature change in vector form. A final target temperature and a ramp rate in addition to a current target temperature (that is, the target temperature of the current time t) are given via the input terminal S in a constant control cycle. The ramp rate indicates a rate of change when the temperature is changing from the target temperature of the current time t to the final target temperature, that is, the amount of the temperature change per unit time. For example, when the ramp rate is set to 1° C./min, the temperature changes at a rate of 1° C. per minute. That is, the target temperature column vector Stg is calculated by inputting the target temperature, the final target temperature and the ramp rate.

Further, a temperature convergence ramp rate is given to the target temperature column calculator 870 from the host controller 36 for a period of time set in advance. The temperature convergence ramp rate indicates a rate of change when the temperature is changing from a current temperature (that is, the furnace temperature of the current time t) to the final target temperature, that is, the amount of the temperature change per unit time. For example, when the temperature convergence ramp rate is set to 1° C./min, it indicates that the temperature changes at a rate of 1° C. per minute. During the period set in advance in which the temperature convergence ramp rate is given, the target temperature column calculator 870 calculates the target temperature column vector Stg up to the final target temperature at the rate of change of the temperature convergence ramp rate using the furnace temperature of the current time t (which is the current temperature) instead of the ramp rate using the target temperature of the current time t. That is, when using the temperature convergence ramp rate, the target temperature column vector Stg is calculated by inputting the furnace temperature of the current time t, the final target temperature and the temperature convergence ramp rate. That is, during the period set in advance (for example, during a period in which an overshoot is likely to occur), the target temperature column vector Stg indicating the future target temperature column is updated according to the furnace temperature of the current time t (which is the current temperature), the final target temperature and the temperature convergence ramp rate. As a result, it is possible to suppress an occurrence of the overshoot, and it is also possible for the furnace temperature to quickly converge to the target temperature.

The target temperature column vector Stg is calculated for the number of the furnace temperatures to be controlled (that is, the number of the zones). For the following description, the target temperature column vector Stg is represented by the Mathematical Relation 7 below.

[Mathematical Relation 7]

$$S_{tg}(t) = \begin{bmatrix} S_{tg}(t+1) \\ S_{tg}(t+2) \\ S_{tg}(t+3) \\ \vdots \end{bmatrix}$$

Hereinafter, the Mathematical Relation 7 may also be referred to as "Formula 5".

The time and the number of rows in the Formula 5 correspond to the time and the number of rows in the Formula 4. Hereinafter, when distinguishing the target temperature column vector Stg according to the corresponding zone, for example, the target temperature column vector corresponding to "ZONE A" is represented by Stg-a and the target temperature column vector corresponding to "ZONE E" is represented by Stg-e.

Since the heater 206 is divided, the set including the temperature history memory 800, the power supply value history memory 802, the individual characteristics creating processor 804 and the target temperature column calculator 870 is actually provided in a plural number equal to the number of the zones (that is, the number of divisions of the heater 206). However, in order to simplify the illustration, only one set of the temperature history memory 800 through the target temperature column calculator 870 is shown in FIG. 6. The same applies to the input terminal S and the input terminal F.

The unified characteristics creating processor 808 is configured to create a unified characteristics equation by inputting the individual input response characteristics matrix Ssr and the individual zero response characteristics vector Szr obtained by the individual characteristics creating processor 804 provided as many as the number of zones and by inputting the target temperature column vector Stg obtained by the target temperature column calculator 870 provided as many as the number of zones.

First, the individual input response characteristics matrix Ssr is modified. The individual input response characteristics matrix Ssr indicates the amount of change in the predicted temperature when u(t) is input at time t and u(t) is continuously input thereafter. Assuming that u(t) is not time-invariant and different values of u(t) to u(t+Np−1) are input at all of the control timings, the second term on the right side of the Formula 4 is represented as Mathematical Relation 8 below. In the above description, the symbol Np indicates the number of the rows in the Formula 4.

[Mathematical Relation 8]

$$\begin{bmatrix} C \cdot B & 0 & 0 & \dots & 0 \\ C \cdot A \cdot B & C \cdot B & 0 & \dots & 0 \\ C \cdot A^2 \cdot B & C \cdot A \cdot B & C \cdot B & \dots & 0 \\ \vdots & \vdots & \vdots & \ddots & \vdots \\ C \cdot A^{Np-1} \cdot B & C \cdot A^{Np-2} \cdot B & C \cdot A^{Np-3} \cdot B & \dots & C \cdot B \end{bmatrix} \cdot \begin{bmatrix} u(t) \\ u(t+1) \\ u(t+2) \\ \vdots \\ u(t+Np-1) \end{bmatrix}$$

According to the well-known model predictive control, it is assumed that different values of u(t) through u(t+Np−1) are input at all the timings of computation processing, and the values described above are calculated and found. However, since the computation processing performance of the CPU 712 is not sufficient, according to the embodiments the second term on the right side of the Formula 4 is set as Mathematical Relation 9 below by limiting the input pattern to two stages.

[Mathematical Relation 9]

$$\begin{array}{cc} \overline{\text{HOLDING } u(t)} & \overline{\text{HOLDING } u(t+Ncd)} \end{array}$$

$$\begin{bmatrix} C \cdot B & \dots & 0 & 0 & \dots & 0 \\ \vdots & \vdots & \vdots & \vdots & \vdots & \vdots \\ C \cdot A^{Ncd-1} \cdot B & \dots & C \cdot B & 0 & \dots & 0 \\ C \cdot A^{Ncd} \cdot B & \dots & C \cdot A \cdot B & C \cdot B & \dots & 0 \\ \vdots & \vdots & \vdots & \vdots & \ddots & \vdots \\ C \cdot A^{Np-1} \cdot B & \dots & C \cdot A^{Np-Ncd} \cdot B & C \cdot A^{Np-Ncd-1} \cdot B & \dots & C \cdot B \end{bmatrix}.$$

$$\begin{bmatrix} u(t) \\ \vdots \\ u(t+N_{cd}-1) \\ u(t+N_{cd}) \\ \vdots \\ u(t+Np-1) \end{bmatrix} \begin{array}{l} \left.\begin{array}{l} \\ \\ \end{array}\right\} \begin{array}{l} \text{HOLDING} \\ u(t) \end{array} \\ \left.\begin{array}{l} \\ \\ \end{array}\right\} \begin{array}{l} \text{HOLDING} \\ u(t+Ncd) \end{array} \end{array}$$

-continued $$\begin{bmatrix} C \cdot B & 0 \\ \vdots & \vdots \\ \sum_{i=0}^{Ncd-1} C \cdot A^i \cdot B & 0 \\ \sum_{i=1}^{Ncd} C \cdot A^i \cdot B & C \cdot B \\ \vdots & \vdots \\ \sum_{i=Np-Ncd}^{Np-1} C \cdot A^i \cdot B & \sum_{i=0}^{Np-Ncd-1} C \cdot A^i \cdot B \end{bmatrix} \cdot \begin{bmatrix} u(t) \\ u(t+N_{cd}) \end{bmatrix}$$

In the above description, Ncd is the number of input rows to be held in a first stage. The input u(t) of the first stage is held until time (t+Ncd−1). In a second stage, the input u(t+Ncd) is held thereafter. As described above, the individual input response characteristics matrix Ssr is modified to obtain the following Mathematical Relation 10 from the Formula 4

[Mathematical Relation 10]

$$\Delta y(t) = S_{zr} + S_{dsr} \cdot u_{cd}(t)$$

wherein, $$\Delta y(t) = \begin{bmatrix} \Delta y(t+1) \\ \Delta y(t+2) \\ \Delta y(t+3) \\ \vdots \end{bmatrix}, S_{zr} = \begin{bmatrix} C \cdot A^2 \\ C \cdot A^3 \\ C \cdot A^4 \\ \vdots \end{bmatrix} \cdot x(t-1) + \begin{bmatrix} C \cdot A \cdot B \\ C \cdot A^2 \cdot B \\ C \cdot A^3 \cdot B \\ \vdots \end{bmatrix} \cdot u(t-1)$$

$$S_{dsr} = \begin{bmatrix} C \cdot B & 0 \\ \vdots & \vdots \\ \sum_{i=0}^{Ncd-1} C \cdot A^i \cdot B & 0 \\ \sum_{i=1}^{Ncd} C \cdot A^i \cdot B & C \cdot B \\ \vdots & \vdots \\ \sum_{i=Np-Ncd}^{Np-1} C \cdot A^i \cdot B & \sum_{i=0}^{Np-Ncd-1} C \cdot A^i \cdot B \end{bmatrix}, u_{cd} = \begin{bmatrix} u(t) \\ u(t+N_{cd}) \end{bmatrix}$$

Hereinafter, the Mathematical Relation 10 may also be referred to as "Formula 6".

In the Formula 6, the symbol Sdsr indicates the individual input response characteristics matrix Ssr. When distinguishing the individual input response characteristics matrix Sdsr according to the corresponding zone, for example, the individual input response matrix corresponding to "ZONE A" is represented by Sdsr-a.

Subsequently, all the zones to be controlled are arranged with respect to the Formula 6 and the Formula 5 described above.

[Mathematical Relation 11]

$$\begin{bmatrix} \Delta y_a(t) \\ \Delta y_b(t) \\ \vdots \\ \Delta y_e(t) \end{bmatrix} = \begin{bmatrix} S_{zr-a} \\ S_{zr-b} \\ \vdots \\ S_{zr-e} \end{bmatrix} + \begin{bmatrix} S_{dsr-a} \\ S_{dsr-b} \\ \vdots \\ S_{dsr-e} \end{bmatrix} \cdot u_{cd}(t) = U_{zr} + U_{dsr} \cdot u_{cd}(t)$$

$$U_{tg} = \begin{bmatrix} S_{tg-a}(t) \\ S_{tg-b}(t) \\ \vdots \\ S_{tg-e}(t) \end{bmatrix}$$

Hereinafter, the first formula in the Mathematical Relation 11 may also be referred to as "Formula 7" and the second formula in the Mathematical Relation 11 may also be referred to as "Formula 8".

In a manner described above, the unified characteristics creating processor 808 calculates and outputs a unified input response characteristics matrix Udsr, a unified zero response characteristics vector Uzr and a unified target temperature vector Utg shown in the Formula 7 and the Formula 8.

Subsequently, the constrained optimization calculator 810 calculates an optimal power supply value of the current time t using an effective constraint method for acquiring a minimizing solution under a predetermined constraint condition. Specifically, the constrained optimization calculator 810 calculates the optimal power supply value of the current time t by inputting the unified input response characteristics matrix Udsr, the unified zero response characteristics vector Uzr, and the unified target temperature vector Utg acquired by the unified characteristics creating processor 808, inputting upper and lower limits (limit values) of each zone used in the limiter 812 described later. The effective constraint method and the operation in the constrained optimization calculator 810 to which the effective constraint method is applied will be described later in detail.

The limiter 812 is configured to limit the calculation result to a range that the heater 206 can output, and to set the limited result as the power supply value indicating the electric power supplied to the heater 206. In the embodiments, the output of the limiter 812 refers to a ratio of an output relative to the maximum output of the heater 206, and is limited to 0% to 100%, for example. A limit value of the limiter 812 may vary depending on the heat generation temperature of the heater 206. Therefore, the limiter 812 may be configured to acquire the heater temperature via the input terminal H, to derive the limit value from a temperature limit table (not shown) corresponding to the heater temperature, and to limit the acquired heater temperature by the limit value derived from the temperature limit table. The upper and lower limit values indicating the range that can be outputted by the limiter 812 are available to other processing elements such as the constrained optimization calculator 810.

The power supply 718 is configured to control the amount of the electric power supplied to the heater 206 via the output terminal P such that the amount of the power supplied to the heater 206 corresponds to the power supply value of 0% to 100%.

Since the heater 206 is divided, the set including the limiter 812 and the power supply 718 is actually provided in a plural number equal to the number of the zones (that is, the number of divisions of the heater 206). However, in order to simplify the illustration, only one set of the limiter 812 and the power supply 718 is shown in FIG. 6. The same applies to the output terminal P.

<First Effective Constraint Method>

The first effective constraint method preferably used in the embodiments will be described. Under the constraint condition of the following Formula 10, the first effective constraint method is used to find a solution vector x that maximizes a value of an evaluation function f(x) given by the following Formula 9.

$$f(x) = c^T \cdot x - \frac{1}{2} x^T \cdot Q \cdot x \qquad \text{[Mathematical Relation 12]}$$

$$b \geq A \cdot x$$

Hereinafter, the first formula in the Mathematical Relation 12 may also be referred to as the "Formula 9" and the second formula in the Mathematical Relation 12 may also be referred to as the "Formula 10".

In the Formula 9 and the Formula 10, the symbols c, Q, b and A are given constant matrices or vectors. In addition, the symbol T indicates transposition. It is possible to obtain the solution vector x using the first effective constraint method by performing a flow shown in FIG. 7.

In a step S201, a solution xk in a range in which the equal sign in the Formula 10 is not valid is selected. Then, let the symbols Ae and be be sets of rows where the equal sign is valid among the rows of the Formula 10. In the step S201, both Ae and be are empty sets. Also, let the symbols Ad and bd be sets of rows of the Formula 10 where the equal sign is not valid. In the step S201, Ad is equal to A and bd is equal to b (that is, Ad=A and bd=b).

In a step S203, the following simultaneous equations are solved, and the solutions are given as x and λ. If x is equal to xk (that is, x=xk), the flow proceeds to a step S205. If x is not equal to xk (that is, x≠xk), the flow proceeds to a step S207.

$$\begin{bmatrix} Q & A_e^T \\ A_e & 0 \end{bmatrix} \cdot \begin{bmatrix} x \\ \lambda \end{bmatrix} = \begin{bmatrix} c \\ b_e \end{bmatrix} \qquad \text{[Mathematical Relation 13]}$$

In the step S205, it is determined whether or not all the elements of λ are zero (0) or more. If all the elements of λ are zero (0) or more, the flow proceeds to a step S213. Otherwise, the flow proceeds to a step S211.

In the step S207, α is calculated according to the following Mathematical Relation 14. In the Mathematical Relation 14, the symbols bi and ai are a row extracted from Ad and bd, respectively. If a is equal to 1 (that is, α=1), the flow proceeds to a step S205. If α is less than 1 (that is, α<1), the flow proceeds to a step S209.

$$\overline{\alpha} = \min_{i \in d} \left[ \left\{ \begin{array}{ll} \dfrac{b_i - a_i \cdot x_k}{a_i \cdot (x - x_k)} & (0 < \text{DENOMINATOR}) \\ 1 & (\text{DENOMINATOR} \leq 0) \end{array} \right. \right] \qquad \text{[Mathematical Relation 14]}$$

$$\alpha = \left\{ \begin{array}{ll} \overline{\alpha} & (0 < \overline{\alpha} < 1) \\ 1 & (1 \leq \overline{\alpha}) \end{array} \right.$$

Hereinafter, the second formula in the Mathematical Relation 14 may also be referred to as the "Formula 11".

In the step S209, the constraint [bi, ai] used when a less than 1 (α<1) is obtained according to the Formula 11 is deleted from Ad and bd, and added to Ae and be. Then the flow proceeds to the step S203.

In the step S211, the element of λ which is the minimum of the negative value is selected, the corresponding [bi, ai] of the constraints included in Ae and be is deleted from Ae and be, added to Ad and bd. Then, the flow proceeds to the step 203.

In step S213, the flow is ended with the solution x obtained in the step S203 as an optimal solution.

Figure 7:
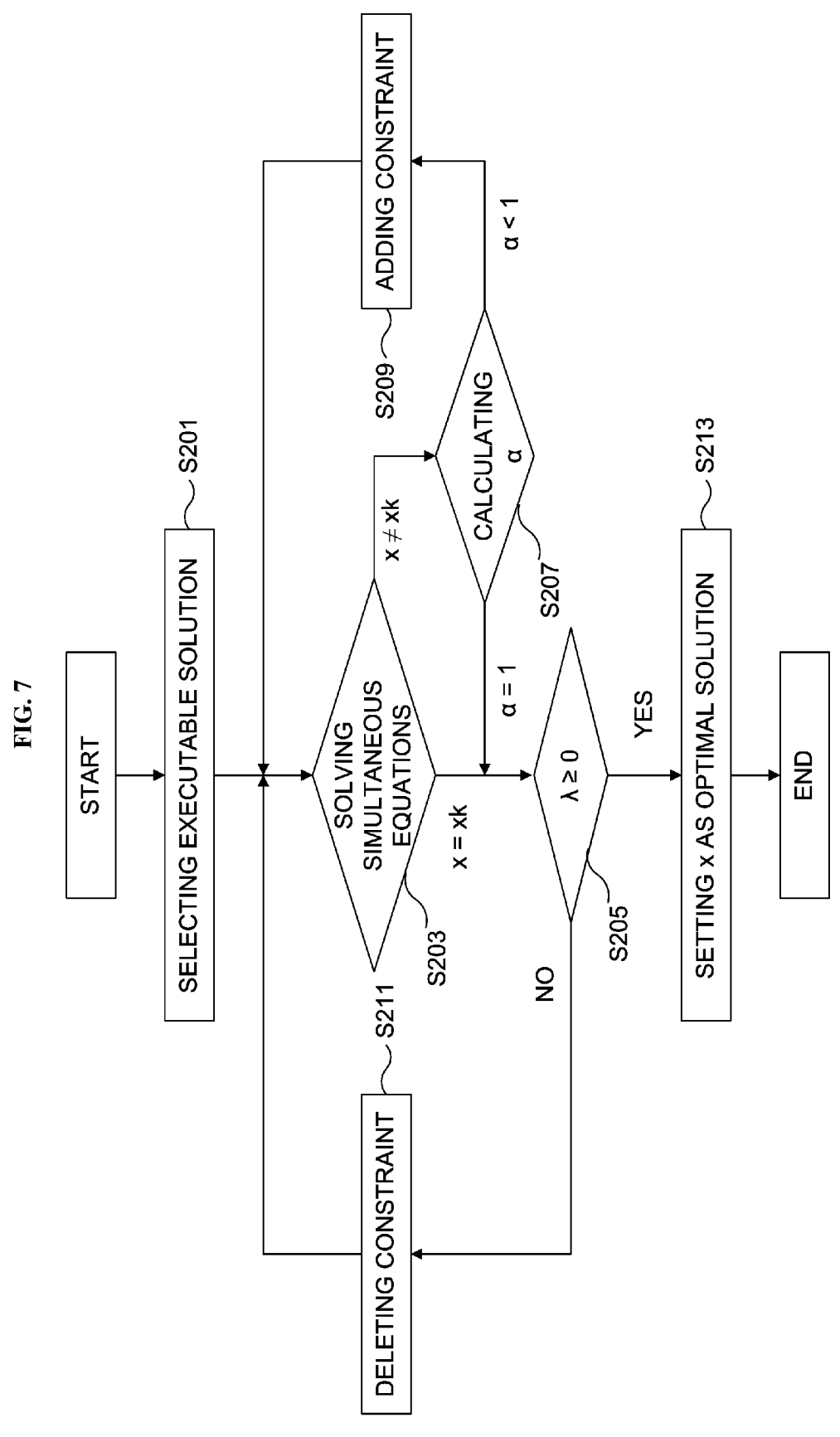
FIG. 7 is a flow chart schematically illustrating a first effective constraint method used in the first embodiments of the present disclosure.

According to the first effective constraint method shown in FIG. 7, a solution that satisfies the Formula 10 and maximizes the Formula 9 is obtained by searching for a combination of rows in which the equal sign is valid among the rows of the Formula 10 using the accessory multiplier λ.

<Application of Effective Constraint Method in Constrained Optimization Calculator 810>

Subsequently, a method of applying the effective constraint method (that is, the first effective constraint method) in the constrained optimization calculator 810 according to the embodiments will be described.

By the unified characteristics creating processor 808, a predicted temperature column (the predicted temperature vector) of the furnace temperature in the Formula 7 is obtained, and a target temperature column (the unified target temperature vector) in the Formula 8 is obtained. Therefore, by the constrained optimization calculator 810, the square of the error (that is, the difference) between the target temperature column and the predicted temperature column is used as the evaluation function. The evaluation function V(u(t)) is represented by the following Mathematical Relation 15.

$$\text{[Mathematical Relation 15]}$$

$$V(u(t)) = [U_{tg} - (U_{zr} + U_{dsr} \cdot u_{cd}(t))]^T \cdot [U_{tg} - (U_{zr} + U_{dsr} \cdot u_{cd}(t))]$$

$$= [U_{tg} - U_{zr}]^T \cdot [U_{tg} - U_{zr}] -$$

$$2 [U_{tg} - U_{zr}]^T \cdot U_{dsr} \cdot u_{cd}(t) + u_{cd}^T(t) \cdot U_{dsr}^T \cdot U_{dsr} \cdot u_{cd}(t)$$

$$= (\text{CONSTANT TERM}) - 2$$

$$\left( [U_{tg} - U_{zr}]^T \cdot U_{dsr} \cdot u_{cd}(t) - \frac{1}{2} u_{cd}^T(t) \cdot U_{dsr}^T \cdot U_{dsr} \cdot u_{cd}(t) \right)$$

$$= (\text{CONSTANT TERM}) - 2$$

$$\left( [U_{dsr}^T \cdot [U_{tg} - U_{zr}]]^T \cdot u_{cd}(t) - \frac{1}{2} u_{cd}^T(t) \cdot [U_{dsr}^T \cdot U_{dsr}] \cdot u_{cd}(t) \right)$$

Hereinafter, the Mathematical Relation 15 may also be referred to as the "Formula 12".

When comparing the Formula 9 with an inside of the parenthesis outside the second term of the Formula 12, the symbols c and Q in the Formula 9 can be replaced by equations in Mathematical Relation 16, respectively.

$$c = U_{dsr}^T \cdot [U_{tg} - U_{zr}], \quad Q = U_{dsr}^T U_{dsr} \qquad \text{[Mathematical Relation 16]}$$

In a manner described above, it is possible to obtain a solution maximizing the inside of the parenthesis outside the second term of the Formula 12 by the effective constraint method described above. Therefore, it is possible to obtain a solution minimizing the evaluation function V(u(t)), and it is also possible to obtain the power supply value minimizing the square of the error (that is, the difference) between the target temperature column and the predicted temperature column.

With respect to the constraint condition of the Formula 10, the "ZONE A" through "ZONE C" up to four times before are exemplified for simplicity of illustration. As shown in the following Formula 13, when the power supply values Pa, Pb and Pc are given with the upper and lower limit values on the left side of the arrow, respectively, it is possible to satisfy the Formula 10 by establishing an inequality expression as shown on the right side of the arrow. In the following Formula 13, the symbols LLa and ULa indicate the upper limit and the lower limit of the power supply value of "ZONE A", respectively, and the symbols LLb, ULb, LLc and ULc indicate the upper and lower limit values of the power supply value of "ZONE B" and "ZONE C", respectively. For example, LLa and ULa are set such that LLa is equal to zero (0) (that is, LLa=0%) and ULa is equal to 80% (that is, ULa=80%).

[Mathematical Relation 17]

$$\begin{matrix} LL_a \le p_a(t) \le UL_a \\ LL_b \le p_b(t) \le UL_b \\ LL_c \le p_c(t) \le UL_c \end{matrix} \Rightarrow \begin{bmatrix} UL_a \\ LL_a \\ UL_b \\ LL_b \\ UL_c \\ LL_c \end{bmatrix} \ge \begin{bmatrix} 1 & 0 & 0 \\ -1 & 0 & 0 \\ 0 & 1 & 0 \\ 0 & -1 & 0 \\ 0 & 0 & 1 \\ 0 & 0 & -1 \end{bmatrix} \cdot \begin{bmatrix} p_a(t) \\ p_b(t) \\ p_c(t) \end{bmatrix}$$

Hereinafter, the Mathematical Relation 17 may also be referred to as the "Formula 13".

<Second Effective Constraint Method>

Hereinafter, a second effective constraint method capable of being used in the embodiments will be described. In the above-described first effective constraint method shown in FIG. 7, when the computation processing capability (that is, the computation processing performance) of the CPU 712 is not sufficient, the calculation described above may not be completed at a predetermined control cycle in some cases. Therefore, instead of the flow shown in FIG. 7, the solution vector x can be obtained by a flow shown in FIG. 8.

Figure 8:
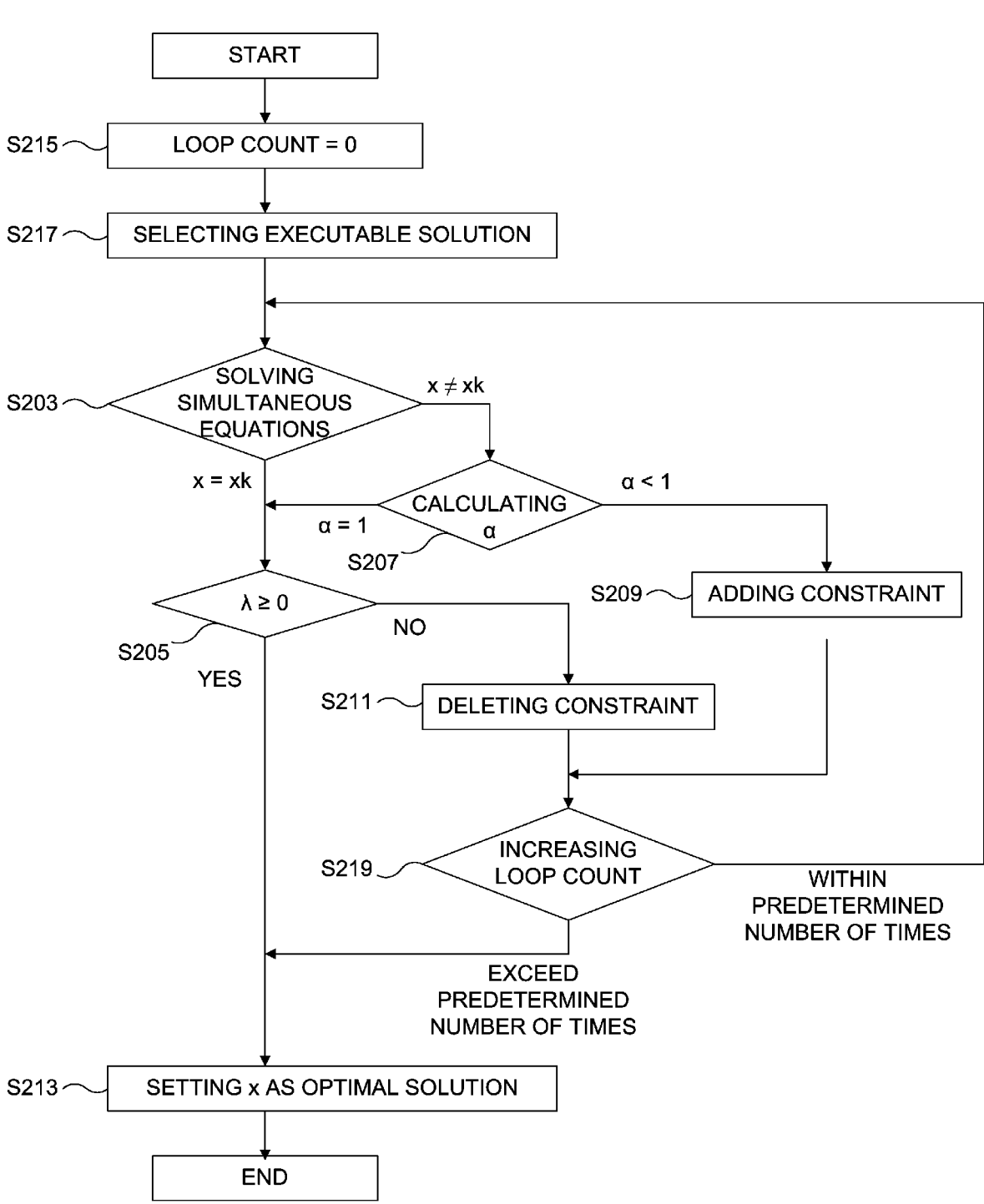
FIG. 8 is a flow chart schematically illustrating a second effective constraint method used in the first embodiments of the present disclosure.

The differences between the second effective constraint method shown in FIG. 8 and the first effective constraint method shown in FIG. 7 lie in that a step S215 is added immediately after a start of the flow, the step S201 in FIG. 7 is replaced with a step S217, the flow proceeds to an added step S219 from the step S209 and the step S211, and the flow proceeds to the step S203 or the step S213 by the determination in the step S219. Hereinafter, only the differences from the first effective constraint method will be explained.

In the step S215, a loop count is initialized.

In the step S217, a solution xk in a range in which the equal sign in the Formula 10 is not valid is selected. In preparation for a case where an optimization calculation is aborted during the calculation in the step 219 described later, in particular, a lower limit of the range in which the equal sign in the Formula 10 is not valid may be selected as the solution xk. For example, when Pa(t) is equal to or greater than zero (0) and equal to or less than 100 (that is, 0≤Pa(t) ≤100) with respect to the constraint of the power supply value Pa of "ZONE A", the selection solution may be set to "Pa(t)=0.1". Thereby, the constraint added in the step S209 gives priority to the lower limit constraint. As a result, even when the optimization calculation is aborted during the calculation in the step 219, a calculation result can be secured.

In the step S219, the loop count is increased by one (1), and when the loop count is within a predetermined number of times, the flow proceeds to the step S203. When the loop count exceeds the predetermined number of times, the flow proceeds to the step S213, and the flow is ended with the solution x obtained in the step S203 performed just before as an optimal solution.

By using the flow as shown in FIG. 8, it is possible to finish the calculation of the optimal solution with the necessary minimum processing. Therefore, it is possible to complete the calculation within a predetermined control cycle (that is, the predetermined number of times).

<Automatic Acquisition Procedure of Thermal Characteristics>

Figure 9:
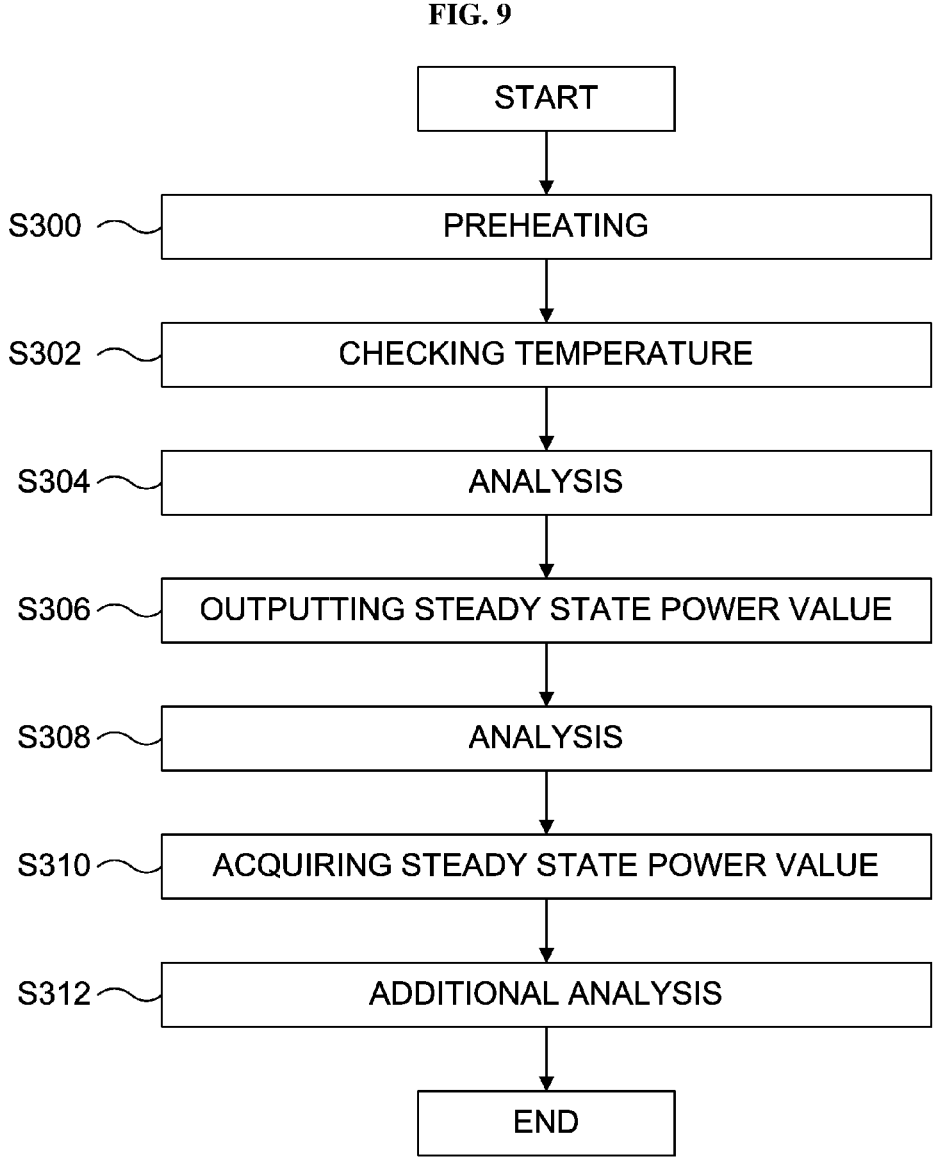
FIG. 9 is a flow chart schematically illustrating an example of a procedure of automatically acquiring thermal characteristics of the temperature controller according to the first embodiment of the present disclosure.

Hereinafter, the automatic acquisition procedure of the thermal characteristics performed by the temperature controller 238 will be described with reference to FIG. 9. The prediction model necessary for the control performed by the temperature controller 238 is created by the following automatic acquisition procedure of the thermal characteristics, and is stored in the prediction model memory area 854.

First, when starting the automatic acquisition procedure of the thermal characteristics, each reference temperature of the furnace temperature is given by the host controller 36. The temperature controller 238 controls the furnace temperature using a feedback control by the PID calculation in a step S300 and a step S302 described below.

In the step S300, the furnace temperature is controlled by the temperature controller 238, and the step S300 is repeatedly performed until the furnace temperature is elevated or lowered to a temperature close to the reference temperature. In the step S300, for example, the parameter used to control the furnace temperature such as the PID parameter (not shown) acquired from the parameter memory area 856 needs to be asymptotically stable. However, the parameter is not necessarily required to be optimal.

In the step S302, the furnace temperature is controlled by the temperature controller 238, and the step S302 is repeatedly performed until the furnace temperature is controlled to the reference temperature and becomes the steady state. In the step S302, for example, the parameter used to control the furnace temperature such as the PID parameter (not shown) acquired from the parameter memory area 856 needs to be asymptotically stable. However, the parameter is not necessarily required to be optimal. In the step S302, when it is determined that the steady state has been reached, the power supply value at that time or an average of the power supply values for a predetermined time period is written as the steady state power value into the prediction model memory area 854. When it is determined that the steady state has been reached, the heater temperature at that time or an average of the heater temperatures for a predetermined time period is written as the reference temperature of the heater temperature into the prediction model memory area 854. In addition, the reference temperature of the furnace temperature is written into the prediction model memory area 854.

In a step S304, a random value is instructed to be output to the heater 206 as the power supply value through the power supply 718 during a time interval set in advance from the start of the step S304. In addition, the current and past data of the furnace temperature and the heater temperature are acquired from the temperature history memory area 850, and the current and past data of the power supply value are acquired from the power supply value history memory area 852. Then, using the current and past data of the furnace temperature and the current and past data of the power supply value, the prediction model of the furnace temperature is updated and stored. Using the current and past data of the heater temperature and the current and past data of the power supply value, the prediction model of the heater temperature is updated and stored.

The random value described above refers to a value selected randomly from quaternary discrete values centered on the steady state power value stored in the prediction model memory area 854. Then, the power supply value of the zone is changed with a time interval set in advance (for example, one minute). The zone to be changed with the time interval is randomly selected. The updating of the prediction model will be described later.

In a step S306, the steady state power value is instructed to be output to the heater 206 as the power supply value through the power supply 718 during a time interval set in advance from the start of the step S306. In addition, the current and past data of the furnace temperature and the heater temperature are acquired from the temperature history memory area 850, and the current and past data of the power supply value are acquired from the power supply value history memory area 852. Then, using the current and past data of the furnace temperature and the current and past data of the power supply value, the prediction model of the furnace temperature is updated and stored. Using the current and past data of the heater temperature and the current and past data of the power supply value, the prediction model of the heater temperature is updated and stored.

In a step S308, the same processing as in the step S304 is performed. Additionally, the updated prediction model is evaluated in the step S308. As a result of the evaluation, when it is determined that the prediction model is valid, the flow proceeds to a step S310. The evaluation of the prediction model will be described later.

In the step S310, using the prediction model acquired in the step S308, the furnace temperature is controlled by using the temperature controller 238. This operation is repeatedly performed until the furnace temperature is controlled to the reference temperature and becomes the steady state. When it is determined that the steady state has been reached, the steady state power value, the reference temperature of the heater temperature and the reference temperature are updated in the same manner as in the step S302.

In a step S312, the same processing as in the step S308 is performed. As a result of the evaluation, when it is determined that the prediction model is valid, the automatic acquisition procedure of the thermal characteristics is ended.

Figure 10:
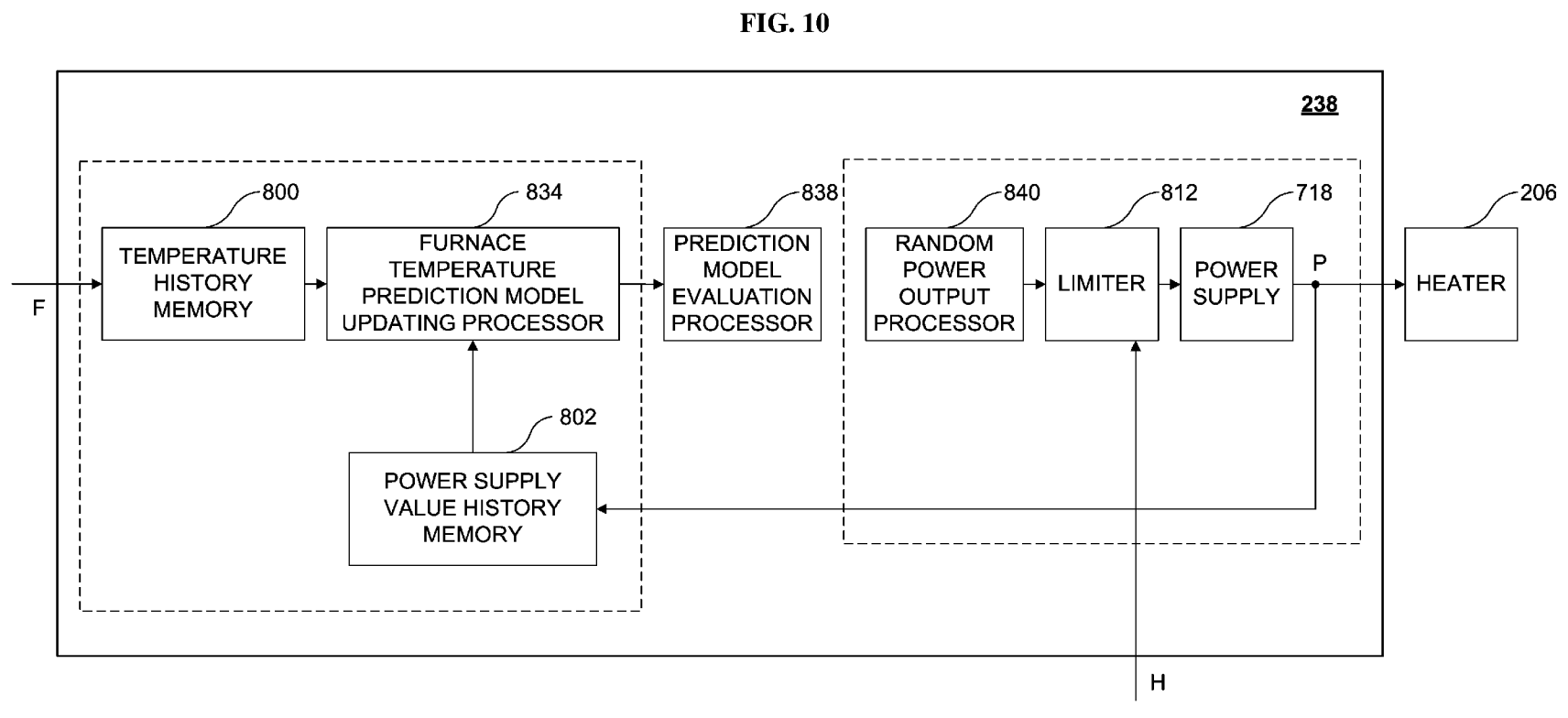

FIG. 10 is a block diagram illustrating an internal control configuration of the temperature controller 238 preferably used to perform the steps S304, S308 and S312 of the automatic acquisition procedure of the thermal characteristics.

Referring to FIG. 10, the temperature controller 238 includes components such as a furnace temperature prediction model updating processor 834, a prediction model evaluation processor 838 and a random power output processor 840. Values such as the reference temperature and the steady state power value which are related to the prediction model and which have been acquired recently are already stored in the prediction model memory area 854.

First, as described above in the step S304, the random power output processor 840 outputs the value selected randomly from quaternary discrete values centered on the steady state power value indicating the steady state level of electric power supplied to the limiter 812. In addition, as described later, the number of the random power output processors 840 is equal to the number of the zones (that is, the number of divisions of the heater 206). Each random power output processor 840 is associated with other random power output processor 840 in order to change the power supply value of the zone with a time interval set in advance (for example, one minute). The zone to be changed with the time interval is randomly selected.

Subsequently, the furnace temperature prediction model updating processor 834 acquires the prediction model of the furnace temperature of the zone from the prediction model memory area 854, acquires the current and past data of the furnace temperature from the temperature history memory area 850, acquires the current and past data of the power supply value from the power supply value history memory area 852, and calculates and updates the latest prediction model of the furnace temperature obtained at that time.

Since the heater 206 is divided, the set including the furnace temperature prediction model updating processor 834 and the random power output processor 840 is actually provided in a plural number equal to the number of the zones (that is, the number of divisions of the heater 206). However, in order to simplify the illustration, only one set of the furnace temperature prediction model updating processor 834 and the random power output processor 840 is shown in FIG. 10.

Subsequently, the prediction model evaluation processor 838 acquires the prediction model of the furnace temperature provided as many as the number of zones at an evaluation interval set in advance (for example, 10 minutes), and evaluates the acquired prediction model until the next acquisition timing after the evaluation interval. As a result of the evaluation, the prediction model evaluation processor 838 determines whether or not the acquired prediction model is valid.

<Method of Updating Prediction Model>

Subsequently, a method of updating the prediction model performed by the furnace temperature prediction model updating processor 834 shown in FIG. 10 through the steps S304, S308 and S312 described above will be described. The method of updating the prediction model according to the embodiments of the present disclosure may be performed using a method called sequential least squares method. The Formula 1 is represented by the following Mathematical Relation 18 by using a matrix and a vector.

$$\Delta y(t) = x^T(t) \cdot \theta(t) \qquad \text{[Mathematical Relation 18]}$$

$$x(t) = \begin{bmatrix} y(t-1) \\ y(t-2) \\ p_a(t-1) \\ \vdots \\ p_a(t-n) \\ p_b(t-1) \\ \vdots \\ p_b(t-n) \\ \vdots \\ p_e(t-n) \\ 1 \end{bmatrix}, \ \theta(t) = \begin{bmatrix} a_1(t) \\ a_2(t) \\ ma_1(t) \\ \vdots \\ ma_n(t) \\ mb_1(t) \\ \vdots \\ mb_n(t) \\ \vdots \\ me_n(t) \\ bi \end{bmatrix}$$

Hereinafter, the first formula in the Mathematical Relation 18 may also be referred to as the "Formula 14".

In the Mathematical Relation 18, the time t indicates the time when the current processing is performed. The latest data among the elements of x(t) is set to y(t−1) because the time when the temperature and the power supply value are obtained by the current processing is the time (t−1) as described above.

The coefficients θ(t) of the latest prediction model shown in the Formula 14 is calculated as shown in the following Mathematical Relation 19.

[Mathematical Relation 19]

$$\theta(t) = \theta(t-1) + \eta(t) \cdot k(t)$$

$$k(t) = \frac{P(t-1) \cdot x(t-1)}{\rho + x^T(r-1) \cdot P(t-1) \cdot x(t-1)}$$

$$\eta(t) = y(t-1) - x^T(t-1) \cdot \theta(t-1)$$

-continued $$P(t) = \frac{1}{\rho}\left(P(t-1) - k(t) \cdot x^T(t-1) \cdot P(t-1)\right)$$

Hereinafter, the first formula in the Mathematical Relation 19 may also be referred to as the "Formula 15".

In the Mathematical Relation 19, y(t−1) indicates a temperature acquired currently (that is, acquired at time t), which is the furnace temperature as an object of the prediction model. The symbol ρ indicates a parameter called as a forgetting factor, and is acquired from the parameter memory area 856. The symbol P(t) indicates a coefficient error correlation matrix. For example, a unit matrix (also referred to as an "identity matrix") having elements of, for example, 100 to 1,000 is set as an initial value of the coefficient error correlation matrix P(t).

Depending on the input x(t), θ(t) obtained by the Formula 15 may be inappropriate for estimating the temperature or the temperature may be oscillated when the temperature is controlled using θ(t). Therefore, when the first through fourth conditions for updating the model described below are met, instead of following the formulas in the Mathematical Relation 19, the coefficient error correlation matrix P(t) and the coefficient θ(t) of the prediction model is set to the same value as the previous time.

The first condition for updating the model is a condition in which the temperature as the object of the prediction model deviates from around the reference temperature (for example, ±50° C.).

The second condition for updating the model is a condition in which at least one element of the coefficient θ(t) of the prediction model deviates from a range set in advance (for example, −100 to +100).

The third condition for updating the model is a condition in which the sum of ma1(t) through man(t), mb1(t) through mbn(t), . . . , me1(t) through men(t) among the elements of the coefficient θ(t) of the prediction model is negative.

The fourth condition for updating the model is a condition in which a transfer function constituted by a1(t) and a2(t) among the elements of the coefficient θ(t) of the prediction model is unstable. The transfer function may be represented as shown in the following Mathematical Relation 20.

$$\frac{1}{1 - a_1(t) \cdot z^{-1} - a_2(t) \cdot z^{-2}} \qquad \text{[Mathematical Relation 20]}$$

However, when the number of the calculation in the Formula 15 is small, depending on the input x(t), the first to fourth conditions for updating the model may be met successively. When the first to fourth conditions for updating the model are met successively, the prediction model having a desired accuracy may not be obtained after all. Therefore, it is also possible to update the coefficient θ(t) of the prediction model by ignoring the first to fourth conditions for updating the model for a predetermined number of times set in advance.

When the coefficient θ(t) of the prediction model obtained by the Formula 15 does not correspond to any one of the first to fourth conditions described above, the coefficient θ(t) is stored in the prediction model memory area 854 with the coefficient error correlation matrix P(t).

The coefficient θ(t) of the prediction model is determined when the result of the evaluation is appropriate in the steps S304, S308 and S312 described above. The coefficient θ(t)

is read out and used by the components such as the individual characteristics creating processor 804 shown in FIG. 6.

<Evaluation Method of Prediction Model>

Hereinafter, an evaluation method of the prediction model performed by the prediction model evaluation processor 838 shown in FIG. 10 in the steps S304, S308 and S312 described above will be described.

The prediction model evaluation processor 838 acquires the prediction model of the furnace temperature at an evaluation interval set in advance (for example, 10 minutes), and evaluates the acquired prediction models before the next acquisition timing. When all of the first to third conditions related to the evaluation method described below are satisfied, the prediction model evaluation processor 838 determines that the acquired prediction models are valid.

The first condition related to the evaluation method is a condition in which all of the acquired prediction models do not correspond to any of the first through fourth conditions for updating the model described above.

The second condition related to the evaluation method is a condition in which the maximum value of Cvg(t) obtained by the following Mathematical Relation 21 for all of the prediction models is equal to or less than a convergence determination value set in advance. The symbol Cvg(t) indicates a total sum of change amounts of the prediction model coefficients, and is calculated at all the timings at which the prediction models are updated.

$$Cvg(t) = [\theta(t) - \theta(t-1)]T \cdot [\theta(t) - \theta(t-1)] \qquad \text{[Mathematical Relation 21]}$$

Hereinafter, the Mathematical Relation 21 may also be referred to as the "Formula 16".

The third condition related to the evaluation method is a condition in which all of the values of the prediction error Epe(t) obtained using prediction model are equal to or less than an error judgment value set in advance. The prediction error Epe(t) is calculated at all the timings of processing with the evaluation interval. The prediction error Epe(t) in the evaluation method is calculated by the following Mathematical Relation 22.

$$E_{pe}(t) = y(t-1) = \Delta y(t-1) \qquad \text{[Mathematical Relation 22]}$$

wherein, $$\Delta y(t-1) = x^T(t-1) \cdot \theta$$

$$\theta = \begin{bmatrix} a_1 \\ a_2 \\ ma_1 \\ \vdots \\ ma_n \\ mb_1 \\ \vdots \\ mb_n \\ \vdots \\ me_n \\ bi \end{bmatrix}$$

Hereinafter, the first formula in the Mathematical Relation 22 may also be referred to as the "Formula 17".

The coefficient θ of the prediction model shown in the Mathematical Relation 22 is obtained by the first processing on the basis of the evaluation interval, and is set to a constant since it remains unchanged until the next acquisition processing of acquiring the coefficient θ is performed after the evaluation interval has elapsed. Then, the input x(t) is set as follows in the first processing on the basis of the evaluation interval.

$$x(t-1) = \begin{bmatrix} y(t-2) \\ y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$ [Mathematical Relation 23]

Then, the input x(t) is set as follows in the second processing on the basis of the evaluation interval.

$$x(t-1) = \begin{bmatrix} \Delta y(t-2) \\ y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$ [Mathematical Relation 24]

Then, the input x(t) is set as follows in the third processing on the basis of the evaluation interval.

$$x(t-1) = \begin{bmatrix} \Delta y(t-2) \\ \Delta y(t-3) \\ p_a(t-2) \\ \vdots \\ p_a(t-n-1) \\ p_b(t-2) \\ \vdots \\ p_b(t-n-1) \\ \vdots \\ p_e(t-n-1) \\ 1 \end{bmatrix}$$ [Mathematical Relation 25]

That is, at the timing of the first processing of acquiring the prediction model for the evaluation, the current and past measurement temperatures (that is, the current and past data) acquired from the temperature history memory area 850 are used as the past temperature which is the basis of the prediction. However, at the timing of the next processing such as the second processing, the predicted temperatures calculated in the previous processing are used.

Hereinafter, as a part of a manufacturing process of a semiconductor device, an exemplary substrate processing (that is, a method of performing the process such as the oxidation process and the diffusion process) on the wafer 200 will be described with reference to FIGS. 11A and 11B. The substrate processing is performed by using the process furnace 202 of the substrate processing apparatus described above. In the following description, operations of the components constituting the substrate processing apparatus are controlled by the main controller 240.

<Step S101>

First, the wafers 200 are charged (transferred or loaded) into the boat 217 (wafer charging step). Then, the process chamber 201 is heated such that the inner temperature of the process chamber 201 reaches and is maintained at a target temperature TO. When heating the process chamber 201, the state of the electrical conduction to the heater 206 is feedback-controlled based on the temperature information detected by the first temperature sensor 263 and the second temperature sensor 264 such that a desired temperature distribution of the inner temperature of the process chamber 201 can be obtained.

<Step S102>

Subsequently, as shown in FIG. 1, the boat 217 charged with the wafers 200 is elevated by the boat elevator 115 and loaded (transferred) into the process chamber 201 (that is, the boat 217 is loaded into the furnace) (boat loading step or substrate loading step). With the boat 217 loaded, the seal cap 219 seals the lower end opening of the reaction tube 204 via the base 257 and the O-ring 220. In the step S102, the heater 206 is controlled by the temperature controller 238 to heat the process chamber 201 to the target temperature TO. In addition, an inner atmosphere of the process chamber 201 is exhausted by the exhaust apparatus 246 such that the inner pressure of the process chamber 201 reaches and is maintained at a desired pressure. When exhausting the inner atmosphere of the process chamber 201, the inner pressure of the process chamber 201 is measured by the pressure sensor 245, and the pressure regulator 242 is feedback-controlled based on the measured pressure. Subsequently, the wafers 200 are rotated by rotating the heat insulating cylinder 218 and the boat 217 by the rotator 254.

<Step S103>

When the inner temperature of the process chamber 201 is maintained at the target temperature (that is, the process temperature) T0, the gas is supplied from the process gas supply source and/or the carrier gas supply source. After the flow rate of the gas is controlled (adjusted) to a desired flow rate by the MFC 241, the gas whose flow rate is controlled is supplied to the ceiling portion 233 through the gas supply pipe 232 via the gas introduction structure 230 and the thin pipe 234, and is showered (introduced) into the process chamber 201 through the plurality of gas introduction ports 233a. Then, the gas introduced into the process chamber 201 flows downward in the process chamber 201, and is exhausted through the gas exhaust structure 231 via the exhaust port 231a. The gas contacts the surface of the wafer 200 while passing through the process chamber 201. Thereby, the process such as the oxidation process and the diffusion process can be performed on the wafer 200.

<Step S104>

After a predetermined processing time (for example, from 1 second to 60 seconds) has elapsed, an inert gas is supplied into the process chamber 201 through the inert gas supply source. Thereby, the inner atmosphere of the process chamber 201 is replaced with the inert gas, and the inner pressure of the process chamber 201 is returned to a normal pressure (atmospheric pressure). Thereafter, the seal cap 219 is lowered by the boat elevator 115 and the lower end opening of the reaction tube 204 is opened. The boat 217 with the processed wafers 200 charged therein is unloaded out of the reaction tube 204 through the lower end opening of reaction tube 204 (boat unloading step or substrate unloading step). Then, the processed wafers 200 are discharged (transferred) out of the boat 217 (wafer discharging step).

Figures 11A, 11B:
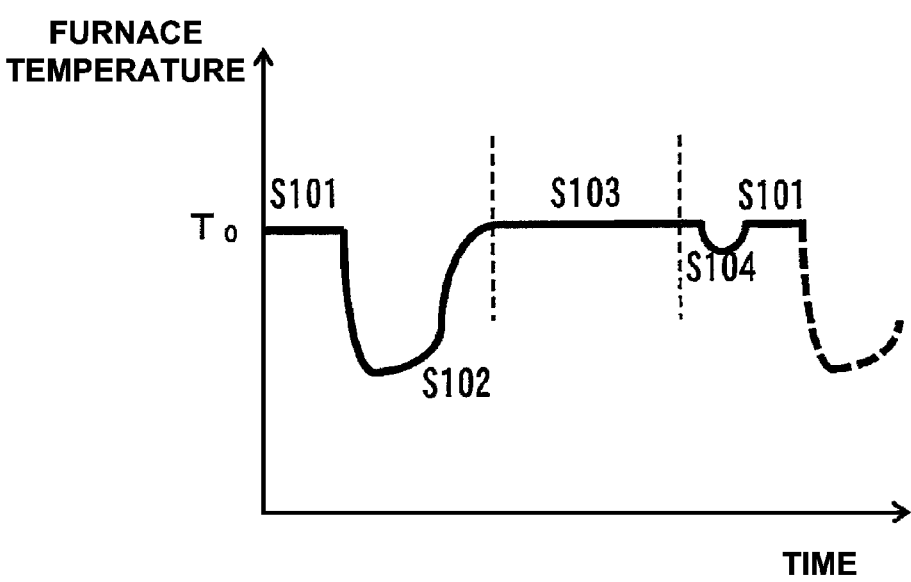
FIG. 11A is a flow chart schematically illustrating an example of a substrate processing.
FIG. 11B is a diagram schematically illustrating changes in an inner temperature of a furnace in each step shown in FIG. 11A.

As shown in FIG. 11B, even when the furnace temperature (which is the inner temperature of the furnace, that is, the inner temperature of the process chamber 201) is elevated and maintained at the target temperature TO in the step S101, the furnace temperature temporarily becomes lower than the target temperature TO since an outer atmosphere of the furnace is introduced into the furnace when the wafers 200 accommodated in the boat 217 are loaded into the process chamber 201 in the boat loading step (that is, the step S102). Then, after the furnace temperature is stabilized and maintained at the target temperature TO, the processing (step S103) is performed. However, it is preferable to shorten a recovery time for quickly converging the furnace temperature to the target temperature TO serving as the process temperature.

For example, in the boat loading step (that is, the step S102) described above, by using the temperature controller 238 described above, the temperature controller 238 controls the current heater supply power such that the predicted temperature column calculated according to the furnace temperature prediction model stored in advance in the program storage area 726 can approach the future target temperature column. Thereby, it is possible for the furnace temperature to quickly converge to the target temperature TO. As a result, it is possible to shorten a recovery time from the boat loading step (step S102) to the processing (step S103). In addition, the temperature controller 238 can be used in the boat unloading (step S104) in a similar manner.

Figure 12:
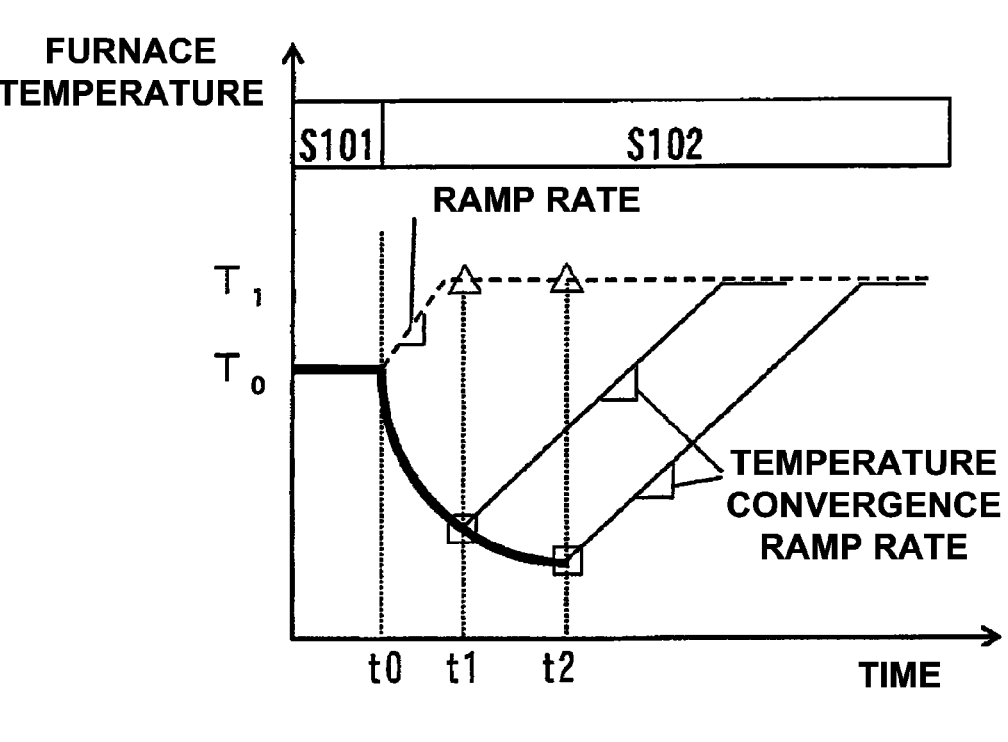
FIG. 12 is a diagram for explaining a processing in a step S102 of FIG. 11A when using the temperature controller according to the first embodiment of the present disclosure.

FIG. 12 is a diagram for explaining a processing by the target temperature column calculator 870 in the boat loading step (step S102) when using the temperature controller 238 described above.

As shown in FIG. 12, the boat loading step (step S102) is started at a timing of a time t0 after the furnace temperature is maintained at the target temperature T0 in the step S101. The final target temperature in the step S102 is set to T1. Further, the furnace temperature is lowered from T0 by loading the wafer 200 into the furnace.

For example, in a case of a control using the ramp rate described above in the target temperature column calculator 870, the current target temperature after the time t0, the final target temperature after the time t0 and the ramp rate after the time t0 are given. In each control cycle (for example, at timings of a time t1 and a time t2), let Stg (t+1) be the current target temperature indicated by the triangle (Δ) shown in FIG. 12, and the target temperature column vector Stg is calculated along the dashed line in FIG. 12 calculated from the ramp rate and the final target temperature.

On the other hand, during the period set in advance, for example, during the period in which the overshoot is likely to occur such as the boat loading step (step S102) and the boat unloading step (step S104), the temperature convergence ramp rate at timings after the time t0 is given. Then, in each control cycle (for example, at timings of the time t1 and the time t2), let Stg (t+1) be the current furnace temperature indicated by the square (□) shown in FIG. 12, and the target temperature column vector Stg is calculated along the solid line in FIG. 12 calculated from the temperature convergence ramp rate and the final target temperature. That is, during the period set in advance, the target temperature column calculator 870 updates the future target temperature column according to the current temperature, the final target temperature and the temperature convergence ramp rate. As a result, it is possible to suppress the occurrence of the overshoot, and it is also possible for the furnace temperature to quickly converge to the target temperature.

Second Embodiment of Present Disclosure

Figure 13:
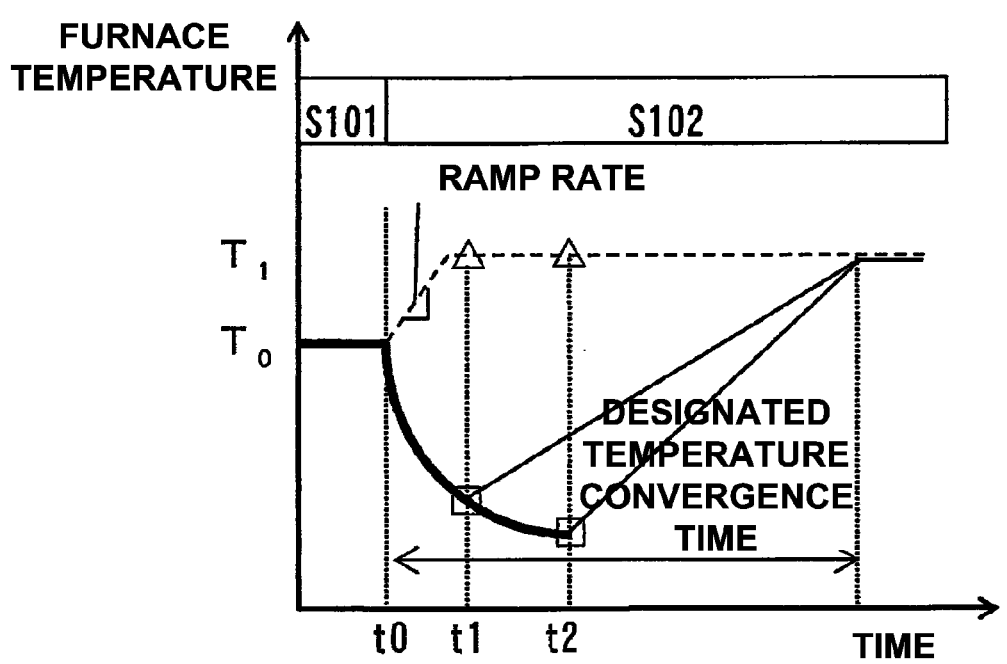
FIG. 13 is a diagram for explaining the processing in the step S102 of FIG. 11A when using a temperature controller according to a second embodiment of the present disclosure.

Hereinafter, a second embodiment according to the technique of the present disclosure will be described. FIG. 13 is a diagram for explaining the processing in the step S102 of FIG. 11A when using a temperature controller according to the second embodiment of the present disclosure.

In the second embodiment of the present disclosure, instead of the target temperature column calculator 870 described above, a target temperature column calculator of the second embodiment is used.

The target temperature and the like from the host controller 36 is input to the target temperature column calculator of the second embodiment via the input terminal S, and the furnace temperature is input to the target temperature column calculator of the second embodiment via the input terminal F. Then, the target temperature column calculator of the second embodiment calculates the target temperature column vector Stg.

The final target temperature and the ramp rate in addition to the current target temperature are given to the target temperature column calculator of the second embodiment via the input terminal S in the constant control cycle. Further, a designated temperature convergence time from the host controller 36 is given to the target temperature column calculator of the second embodiment at an appropriate timing. The designated temperature convergence time indicates a value for calculating the rate of change when the current target temperature is changed from the current furnace temperature (that is, the furnace temperature of the current time t) to the final target temperature, wherein the current target temperature reaches the final target temperature at the rate of change. For example, when the designated temperature convergence time is set to 10 minutes, the target temperature column calculator of the second embodiment calculates the target temperature column vector Stg for changing the current furnace temperature to the final target temperature such that the final target temperature is reached 10 minutes after the timing when the designated temperature convergence time is input from the host controller 36. For example, the target temperature column calculator of the second embodiment updates the target temperature column vector Stg indicating the future target temperature column according to the furnace temperature of the current time t (which is the current furnace temperature), the final target temperature and the designated temperature convergence time.

For example, the target temperature column calculator of the second embodiment includes a counter therein, and the counter is started at the timing when the designated temperature convergence time is given. Then, the target temperature column calculator of the second embodiment calculates the target temperature column vector Stg according to a counter value, the furnace temperature of the current time t (which is the current furnace temperature) and the final target temperature. The target temperature column vector Stg is calculated to be as many as the number of furnace temperatures to be controlled (that is, the number of the zones), and the number of rows of the target temperature column vector Stg corresponds to the number of rows in the Formula 4.

As shown in FIG. 13, similarly to FIG. 12, the boat loading step (step S102) is started at the timing of the time t0 after the furnace temperature is maintained at the target temperature T0 in the step S101. The final target temperature in the step S102 is set to T1. Further, the furnace temperature is lowered from T0 by loading the wafer 200 into the furnace.

For example, in the case of the control using the ramp rate described above in the target temperature column calculator of the second embodiment, the current target temperature after the time t0, the final target temperature after the time t0 and the ramp rate after the time t0 are given. In each control cycle (for example, at timings of the time t1 and the time t2), let Stg (t+1) be the current target temperature indicated by the triangle (Δ) shown in FIG. 13, and the target temperature column vector Stg is calculated along the dashed line in FIG. 13 calculated from the ramp rate and the final target temperature.

On the other hand, during the period set in advance, for example, during the period in which the overshoot is likely to occur such as the boat loading step (step S102) and the boat unloading step (step S104), the designated temperature convergence time described above at the timing of the time t0 is given. Then, in each control cycle (for example, at the timings of the time t1 and the time t2), let Stg (t+1) be the current furnace temperature indicated by the square (□) shown in FIG. 13, and the target temperature column vector Stg is calculated along the solid line in FIG. 13 calculated from a remaining time until the designated temperature convergence time and the final target temperature. As a result, it is possible to suppress the occurrence of the overshoot, and it is also possible for the furnace temperature to quickly converge to the target temperature.

Third Embodiment of Present Disclosure

Figure 14:
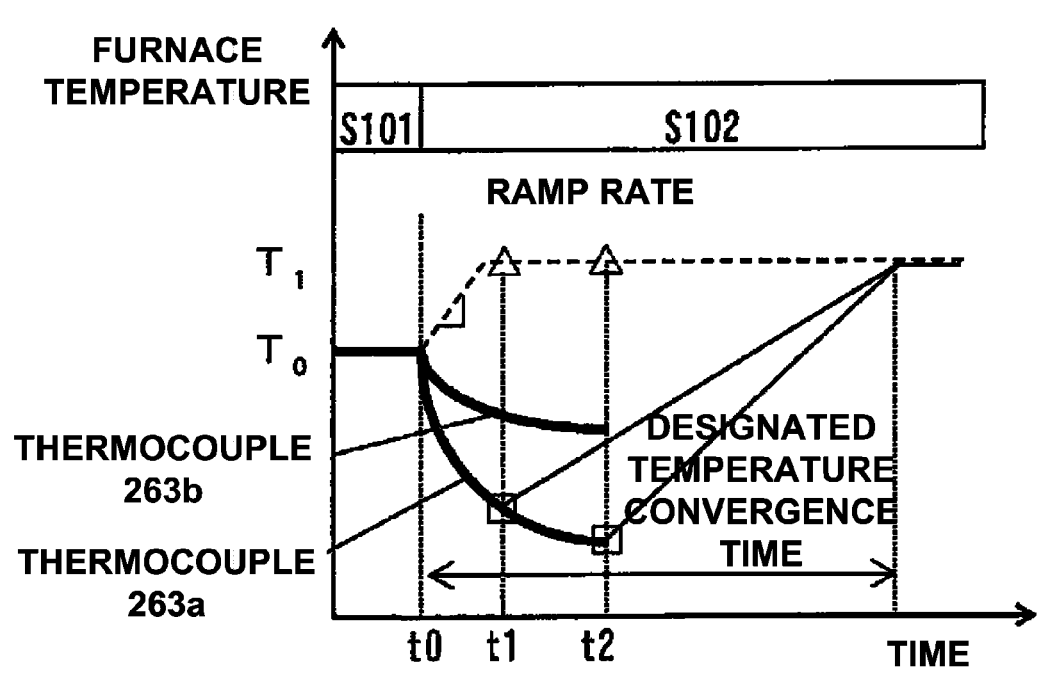
FIG. 14 is a diagram for explaining the processing in the step S102 of FIG. 11A when using a temperature controller according to a third embodiment of the present disclosure.

Hereinafter, a third embodiment according to the technique of the present disclosure will be described. FIG. 14 is a diagram for explaining the processing in the step S102 of FIG. 11A when using a temperature controller according to the third embodiment of the present disclosure.

In the third embodiment of the present disclosure, instead of the target temperature column calculator 870 described above, a target temperature column calculator of the third embodiment is used.

The target temperature and the like from the host controller 36 is input to the target temperature column calculator of the third embodiment via the input terminal S, and the furnace temperature is input to the target temperature column calculator of the third embodiment via the input terminal F. Then, the target temperature column calculator of the third embodiment calculates the target temperature column vector Stg.

The final target temperature and the ramp rate in addition to the current target temperature are given to the target temperature column calculator of the third embodiment via the input terminal S in the constant control cycle. Further, a designated temperature convergence time and a designated reference zone from the host controller 36 are given to the target temperature column calculator of the third embodiment at an appropriate timing. The designated temperature convergence time indicates a value for calculating the rate of change when the current target temperature is changed from the current furnace temperature (that is, the furnace temperature of the current time t) to the final target temperature, wherein the current target temperature reaches the final target temperature at the rate of change. The designated reference zone indicates a zone of the current furnace temperature when calculating the target temperature column vector Stg in every target temperature column calculator of the third embodiment provided as many as the number of zones. For example, when the designated temperature convergence time is set to 10 minutes and the designated reference zone is set to "ZONE A", the target temperature column calculator of the third embodiment calculates the target temperature column vector Stg for changing the current furnace temperature of "ZONE A" to the final target temperature such that the final target temperature is reached 10 minutes after the timing when the designated temperature convergence time is input from the host controller 36. In other words, the current furnace temperature is replaced with the current furnace temperature of the designated reference zone, and the current furnace temperature of the designated reference zone is applied as the current furnace temperature. Then, the target temperature column vector Stg is calculated such that the final target temperature is reached at the designated temperature convergence time for the designated reference zone. That is, the target temperature column calculator of the third embodiment updates the future target temperature column according to the furnace temperature of the current time t (which is the current furnace temperature), the final target temperature and the designated temperature convergence time.

As shown in FIG. 14, similarly to FIG. 12, the boat loading step (step S102) is started at the timing of the time t0 after the furnace temperature is maintained at the target temperature TO in the step S101. The final target temperature in the step S102 is set to T1. Further, the furnace temperature is lowered from TO by loading the wafer 200 into the furnace. FIG. 14 illustrates the furnace temperature measured by the thermocouple 263a in "ZONE A" and the furnace temperature measured by the thermocouple 263b in "ZONE B".

For example, in the case of the control using the ramp rate described above in the target temperature column calculator of the third embodiment, the current target temperature after the time t0, the final target temperature after the time t0 and the ramp rate after the time t0 are given. In each control cycle (for example, at the timings of the time t1 and the time t2), let Stg (t+1) be the current target temperature indicated by the triangle (Δ) shown in FIG. 14. Then, the target temperature column vector Stg is calculated along the dashed line in FIG. 14 calculated from the ramp rate and the final target temperature.

On the other hand, during the period set in advance, for example, during the period in which the overshoot is likely to occur such as the boat loading step (step S102) and the boat unloading step (step S104), the designated temperature convergence time described above at the timing of the time t0 is given. Then, in each control cycle (for example, at the timings of the time t1 and the time t2), let Stg (t+1) be the current furnace temperature indicated by the square (□) shown in FIG. 14. Then, the target temperature column vector Stg is calculated along the solid line in FIG. 14 calculated from a remaining time until the designated temperature convergence time and the final target temperature. For example, when the designated reference zone is "ZONE A", the target temperature column vector Stg for changing the current furnace temperature of "ZONE A" to the final target temperature is calculated. In addition, for each zone such as "ZONE B", the target temperature column vector Stg is calculated from the current furnace temperature of "ZONE A". As a result, it is possible to suppress the occurrence of the overshoot, and it is also possible for the furnace temperature to quickly converge to the target temperature.

Example of Present Disclosure

Figure 15:
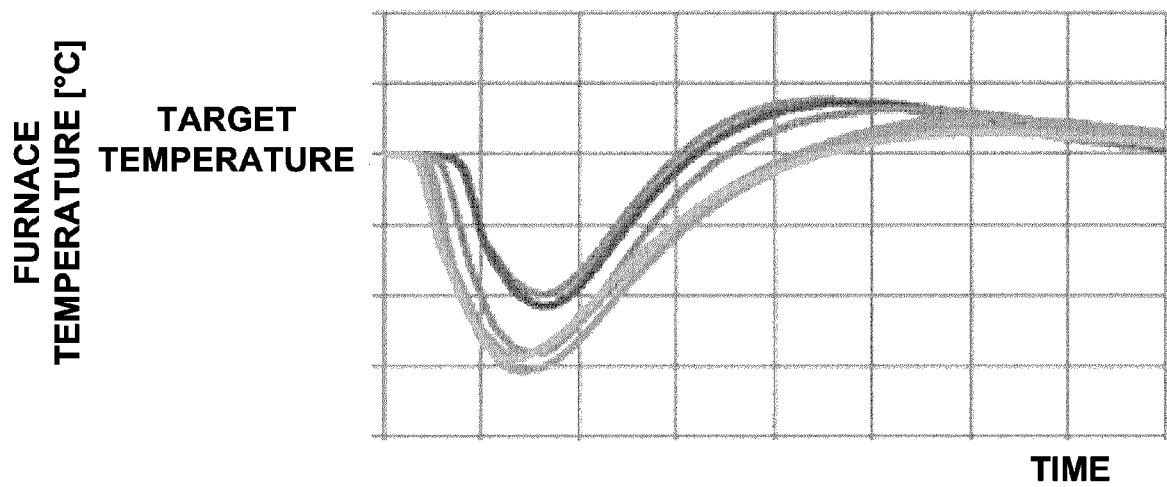
FIG. 15 is a diagram schematically illustrating temperature trajectories in the furnace caused by a temperature control according to a comparative example.
Figure 16A:
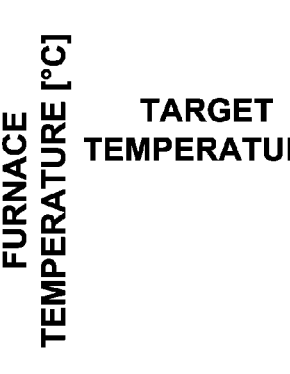
FIG. 16A is a diagram schematically illustrating temperature trajectories in the furnace caused by a temperature control according to an example of embodiments of the present disclosure.
Figure 16A:
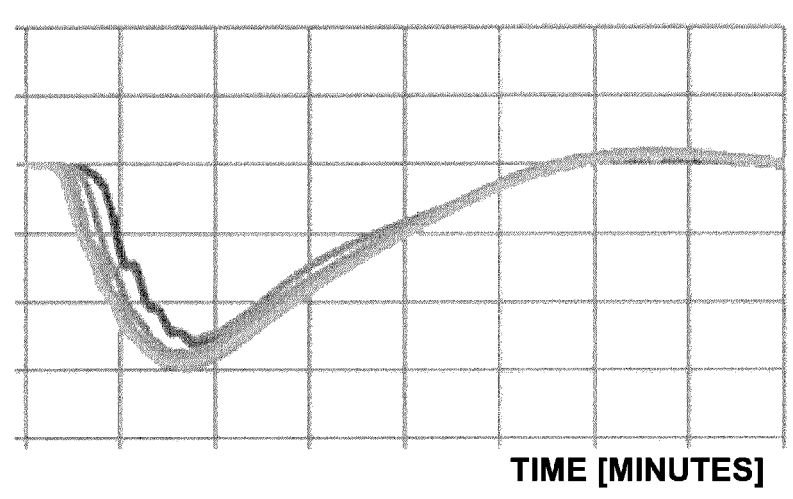
Figure 16B:
FIG. 16B is a diagram schematically illustrating temperature trajectories in the furnace caused by the temperature control according to the example of embodiments of the present disclosure in a case where the number of substrates in the furnace is set to half of that of FIG. 16A.
Figure 16B:
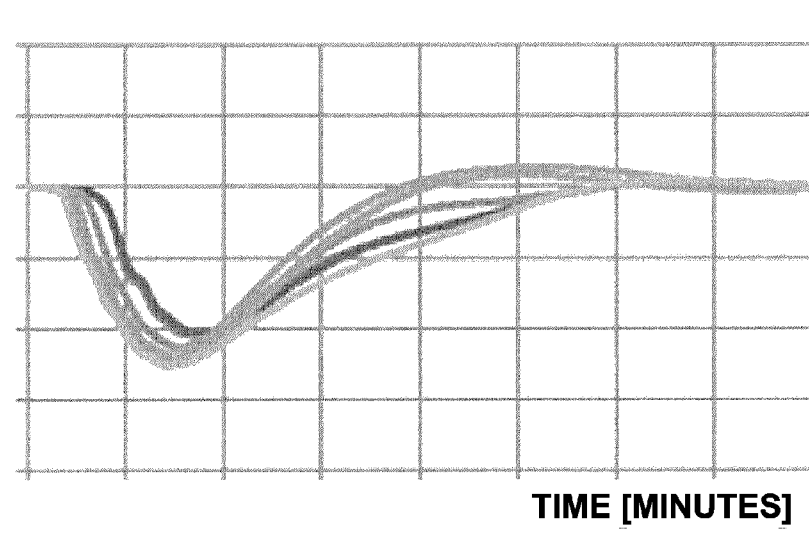

Subsequently, an example of the embodiments of the present disclosure will be described. The furnace temperature in the boat loading step (step S102) described above is converged to the target temperature using a temperature control according to a comparative example and a temperature control according to the example of the present disclosure. FIG. 15 is a diagram schematically illustrating temperature trajectories in each zone by the temperature control using the ramp rate according to the comparative example. FIG. 16A is a diagram schematically illustrating temperature trajectories in each zone by the temperature control according to the example of the present disclosure (more specifically, by the temperature control using the target temperature column calculator of the third embodiment), and FIG. 16B is a diagram schematically illustrating temperature trajectories in each zone by the temperature control using the target temperature column calculator of the third embodiment in a case where the number of substrates in the process chamber 201 is set to be half of that of FIG. 16A.

As shown in FIG. 15, it is confirmed that the overshoot occurs in the temperature control using the ramp rate according to the comparative example, and the temperature of each zone is controlled separately (that is, non-uniformly). It is also confirmed that the recovery time is long.

On the other hand, as shown in FIG. 16A, by performing the temperature control using the target temperature column calculator of the third embodiment of the present disclosure, it is confirmed that the overshoot can be suppressed and an inter-zone deviation of each zone can be reduced. In addition, it is confirmed that the target temperature can be converged faster than in the comparative example, and the recovery time can be shortened as compared with the comparative example. Further, as shown in FIG. 16B, it is also confirmed that the overshoot can be suppressed even when the number of wafers (substrates) loaded into the process chamber is halved and thereby a heating and cooling characteristics of the wafers themselves may change.

As described in detail above, by using the temperature controller 238 according to the embodiments described above, by suppressing the overshoot, it is possible to quickly converge the furnace temperature to the target temperature, and it is also possible to reduce the inter-zone deviation. In addition, even in a case where there is a large variation in the temperature characteristics of each heater or in a case where an engineer in charge does not have enough time, it is possible to automatically obtain the thermal characteristics, and it is also possible to obtain an optimal control method without adjusting parameter or by easily adjusting the parameters. Therefore, it is possible to easily obtain the expected performance of the device.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof.

For example, the embodiments described above are described by way of an example in which the process such as the oxidation process and the diffusion process is performed onto the wafer 200. However, the technique of the present disclosure is not limited thereto. For example, a film-forming process such as a CVD may be performed, and the type of the film is not particularly limited. For example, the technique of the present disclosure may be preferably applied when various films such as a nitride film (SiN film) and a metal oxide film are formed on the wafer 200. Further, the technique of the present disclosure may be preferably applied to various processes such as an annealing process and an epitaxial growth process (also referred to as an "Epi").

For example, the embodiments described above are described by way of an example in which a semiconductor manufacturing apparatus for processing a semiconductor wafer, such as the substrate processing apparatus is used. However, the technique of the present disclosure is not limited thereto. The technique of the present disclosure may be applied to an LCD (Liquid Crystal Display) manufacturing apparatus for processing a glass substrate.

According to some embodiments in the present disclosure, it is possible for the furnace temperature to quickly converge to the target temperature by suppressing the overshoot.

What is claimed is:

1. A method of manufacturing a semiconductor device by using a substrate processing apparatus comprising a heater provided outside a reaction tube and configured to heat a substrate accommodated in a substrate retainer and a controller provided with a temperature history memory area in which temperature data of at least one of a heater temperature or a furnace temperature is stored and a prediction model memory area in which a prediction model of estimating the temperature data of the at least one of the heater temperature or the furnace temperature is stored, wherein the controller is configured to be capable of loading a plurality of substrates comprising the substrate accommodated in the substrate retainer into a process chamber, processing the plurality of substrates and unloading the plurality of substrates from the process chamber, wherein the method comprises:

in loading the plurality of substrates accommodated in the substrate retainer into the process chamber, controlling a current heater supply power such that a predicted temperature column calculated according to the prediction model stored in advance approaches a future target temperature column, wherein the future target temperature column is updated in accordance with a current temperature, a final target temperature and one of a temperature convergence ramp rate and a designated temperature convergence time.

2. A substrate processing apparatus comprising:

a heater provided outside a reaction tube and configured to heat a substrate accommodated in the reaction tube; and a temperature controller provided with: a temperature history memory area in which temperature data of at least one of a heater temperature or a furnace temperature is stored; and a prediction model memory area in which a prediction model of estimating the temperature data of at least one of the heater temperature or the furnace temperature is stored, wherein the temperature controller is configured to be capable of controlling a current heater supply power such that a predicted temperature column calculated according to the prediction model stored in advance approaches a future target temperature column, and updating the future target temperature column in accordance with a current temperature, a final target temperature and one of a temperature convergence ramp rate and a designated temperature convergence time.

3. The substrate processing apparatus of claim 2, wherein the current temperature used in updating the future target temperature column is substituted by another current temperature of a designated reference zone such that the another current temperature of the designated reference zone is used as the current temperature in updating the future target temperature column.

4. The substrate processing apparatus of claim 2, wherein the temperature controller is further configured to be capable of:

calculating an individual input response characteristics matrix indicating a first amount of change in a predicted temperature vector due to being influenced by a power supply value of a current time, and an individual zero response characteristics vector indicating a second amount of change in the predicted temperature vector due to being influenced by the furnace temperature of a past time and the power supply value of the past time, wherein the predicted temperature vector is a vector representation of the predicted temperature column.

5. The substrate processing apparatus of claim 4, wherein the temperature controller is further configured to be capable of:

(a) creating a unified characteristics equation by using the individual input response characteristics matrix, the individual zero response characteristics vector and a target temperature column vector which is a vector representation of the future target temperature column; and (b) calculating the power supply value of the current time by inputting a unified input response characteristics matrix, a unified zero response characteristics vector and a unified target temperature vector calculated in (a), inputting upper and lower limits of each zone and using an effective constraint method and the unified characteristics equation.

6. The substrate processing apparatus of claim 2, wherein the prediction model comprises coefficients related to the prediction model of estimating the temperature data of the at least one of the heater temperature or the furnace temperature, a coefficient error correlation matrix, a reference temperature and a steady state power value.

7. The substrate processing apparatus of claim 6, wherein at least one selected from a group consisting of the coefficients related to the prediction model, the coefficient error correlation matrix, the reference temperature, and the steady state power value is defined for each of the heater temperature and the furnace temperature of each zone.

8. The substrate processing apparatus of claim 6, wherein the prediction model related to the heater temperature in an entirety of zones is paired with the prediction model related to the furnace temperature in the entirety of the zones for each temperature range.

9. The substrate processing apparatus of claim 2, wherein the prediction model is represented by using Formula 1 for calculating a predicted temperature of the furnace temperature, $$\Delta y(t)=a_1 \cdot y(t-1)+a_2 \cdot y(t-2)+ma_1 \cdot p_a(t-1)+ma_2 \cdot p_a(t-2)+ \ldots +ma_n \cdot p_a(t-n)$$

$$+mb_1 \cdot p_b(t-1)+mb_2 \cdot p_b(t-2)+ \ldots +mb_n \cdot p_b(t-n)$$

$$+mc_1 \cdot p_c(t-1)+mc_2 \cdot p_c(t-2)+ \ldots +mc_n \cdot p_c(t-n)$$

$$+md_1 \cdot p_d(t-1)+md_2 \cdot p_d(t-2)+ \ldots +md_n \cdot p_d(t-n)$$

$$+me_1 \cdot p_e(t-1)+me_2 \cdot p_e(t-2)+ \ldots +me_n \cdot p_e(t-n)+bi \quad \text{[Formula 1]}$$

wherein $\Delta y(t)$ indicates a deviation of the predicted temperature from a reference temperature at time t, $y(t-1)$ and $y(t-2)$ indicate deviations from the reference temperature of the temperatures one time before and two times before, respectively, $p_a(t-1)$, $p_a(t-2)$ through $p_a(t-n)$ indicate deviations from a steady state power value of power supply values of a first zone among zones one time before, two times before through n times before, respectively, $p_b(t-1)$, $p_b(t-2)$ through $p_b(t-n)$ indicate deviations from a steady state power value of power supply values of a second zone among the zones one time before, two times before through n times before, respectively, $p_c(t-1)$, $p_c(t-2)$ through $p_c(t-n)$ indicate deviations from the steady state power value of power supply values of a third zone among the zones one time before, two times before through n times before, respectively, $p_d(t-1)$, $p_d(t-2)$ through $p_d(t-n)$ indicate deviations from the steady state power value of power supply values of a fourth zone among the zones one time before, two times before through n times before, respectively, $p_e(t-1)$, $p_e(t-2)$ through $p_e(t-n)$ indicate deviations from the steady state power value of power supply values of a fifth zone among the zones one time before, two times before through n times before, respectively, $a_1$, $a_2$, $ma_1$ through $ma_n$, $mb_1$ through $mb_n$, $mc_1$ through $mc_n$, $md_1$ through $md_n$, $me_1$ through men are coefficients corresponding to respective deviations, bi is a constant term and n is a value set in advance for each parameter.

10. The substrate processing apparatus of claim 2, wherein the prediction model is represented by using Formula 2 for calculating a predicted temperature of the heater temperature, $$\Delta y_h(t)=a_1 \cdot y_h(t-1)+a_2 \cdot y_h(t-2)+m_1 \cdot p(t-1)+m_2 \cdot p(t-2)+ \ldots +m_n \cdot p(t-n)+bi \quad \text{[Formula 2]}$$

wherein $\Delta y_h(t)$ indicates a deviation of the predicted temperature of the heater temperature from a reference temperature at time t, $y_h(t-1)$ and $y_h(t-2)$ indicate deviations of the heater temperature from the reference temperature one time before and two times before, respectively, $p(t-1)$, $p(t-2)$ through $p(t-n)$ indicate deviations of power supply values of a corresponding zone one time before, two times before through n times before from a steady state power value, respectively, $a_1$, $a_2$, $m_1$, $m_2$ through $m_n$ are coefficients corresponding to respective deviations, bi is a constant term and n is a value set in advance for each parameter.

11. The substrate processing apparatus of claim 5, wherein the unified characteristics equation is represented by using Formula 3 and Formula 4, $$\begin{bmatrix} \Delta y_a(t) \\ \Delta y_b(t) \\ \vdots \\ \Delta y_e(t) \end{bmatrix} = \begin{bmatrix} S_{zr}-a \\ S_{zr}-b \\ \vdots \\ S_{zr}-e \end{bmatrix} + \begin{bmatrix} S_{dsr}-a \\ S_{dsr}-b \\ \vdots \\ S_{dsr}-e \end{bmatrix} \cdot u_{cd}(t) = U_{zr} + U_{dsr} \cdot u_{cd}(t) \quad \text{[Formula 3]}$$

$$U_{tg} = \begin{bmatrix} S_{tg-a}(t) \\ S_{tg-b}(t) \\ \vdots \\ S_{tg-e}(t) \end{bmatrix} \quad \text{[Formula 4]}$$

wherein $U_{dsr}$ indicates the unified input response characteristics matrix, $U_{zr}$ indicates the unified zero response characteristics vector and $U_{tg}$ indicates the unified target temperature vector.

12. The substrate processing apparatus of claim 5, wherein the unified characteristics equation comprises the predicted temperature column of the furnace temperature and the future target temperature column of the furnace temperature.

13. The substrate processing apparatus of claim 5, wherein the unified characteristics equation is configured such that a solution vector x that maximizes a value of an evaluation function f(x) represented by using Formula 5 and Formula 6 is obtained, $$f(x) = c^T \cdot x - \frac{1}{2} x^T \cdot Q \cdot x \qquad \text{[Formula 5]}$$

$$b \geq A \cdot x \qquad \text{[Formula 6]}$$

wherein c, Q, b and A are given constant matrices or vectors, and T indicates transposition.

14. The substrate processing apparatus of claim 13, wherein the evaluation function f(x) is configured such that a square of an error between the target temperature column and the predicted temperature column is minimized.

15. A non-transitory computer-readable recording medium storing a program for a substrate processing apparatus comprising a heater provided outside a reaction tube and configured to heat a substrate and a controller provided with a temperature history memory area in which temperature data of at least one of a heater temperature or a furnace temperature is stored and a prediction model memory area in which a prediction model of estimating the temperature data of the at least one of the heater temperature or the furnace temperature is stored, wherein the program causes the controller to perform:

(a) controlling a current heater supply power such that a predicted temperature column calculated according to the prediction model stored in advance approaches a future target temperature column, wherein the future target temperature column is updated in accordance with a current temperature, a final target temperature and one of a temperature convergence ramp rate and a designated temperature convergence time.

\* \* \* \* \*